(12) United States Patent
Joo

(10) Patent No.: US 12,112,056 B2
(45) Date of Patent: Oct. 8, 2024

(54) NON-VOLATILE MEMORY DEVICE AND A METHOD FOR OPERATING THE SAME

(71) Applicant: SAMSUNG ELECTRONICS CO., LTD., Suwon-si (KR)

(72) Inventor: Sang-Hyun Joo, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 18/202,692

(22) Filed: May 26, 2023

(65) Prior Publication Data

US 2024/0004572 A1    Jan. 4, 2024

(30) Foreign Application Priority Data

Jun. 30, 2022   (KR) .................. 10-2022-0080268

(51) Int. Cl.
*G06F 3/06* (2006.01)
*G11C 11/56* (2006.01)
*G11C 16/14* (2006.01)
*G11C 16/16* (2006.01)

(52) U.S. Cl.
CPC .......... *G06F 3/0652* (2013.01); *G06F 3/0604* (2013.01); *G06F 3/0679* (2013.01); *G11C 11/5635* (2013.01); *G11C 16/14* (2013.01); *G11C 16/16* (2013.01); *G11C 2211/5642* (2013.01)

(58) Field of Classification Search
CPC .... G06F 3/0652; G06F 3/0604; G06F 3/0679; G11C 2211/5642; G11C 11/5628; G11C 11/5635; G11C 16/10; G11C 16/16; G11C 16/30; G11C 16/24; G11C 16/0483; G11C 16/14
See application file for complete search history.

(56) References Cited

U.S. PATENT DOCUMENTS

| 7,623,383 B2 | 11/2009 | Park et al. |
| 7,952,935 B2 | 5/2011 | Wang et al. |
| 8,351,273 B2 | 1/2013 | Lee |
| 8,395,940 B2 | 3/2013 | Huh |
| 8,488,381 B2 | 7/2013 | Kim et al. |

(Continued)

FOREIGN PATENT DOCUMENTS

| KR | 10-2008-0014258 A | 2/2008 |
| KR | 10-2012-0005850 A | 1/2012 |

*Primary Examiner* — Francisco A Grullon
(74) *Attorney, Agent, or Firm* — Sughrue Mion, PLLC

(57) ABSTRACT

In some embodiments, a non-volatile memory device includes a control logic circuit configured to generate a program signal and an erase signal based on control signals, a voltage generator configured to generate a program voltage and an erase voltage based on the program signal and the erase signal, a memory cell array including a memory cell, a string select transistor coupled to the memory cell, a bit-line coupled to the string select transistor, and a string select line coupled to the string select transistor, and a page buffer circuit coupled to the bit-line, and including a first precharge transistor that is configured to operate based on the program signal and the erase signal. The first precharge transistor is configured to apply the program voltage and the erase voltage to the bit-line in response to the program signal and the erase signal, respectively.

20 Claims, 21 Drawing Sheets

(56) References Cited

U.S. PATENT DOCUMENTS

| | | | |
|---|---|---|---|
| 8,730,735 B2 | 5/2014 | Park | |
| 2006/0120172 A1* | 6/2006 | Lee | G11C 16/0483 365/189.05 |
| 2020/0365213 A1* | 11/2020 | Jeon | G11C 16/32 |
| 2020/0411107 A1* | 12/2020 | Yu | G11C 16/26 |
| 2021/0225452 A1* | 7/2021 | Yoon | G11C 16/28 |
| 2021/0233588 A1 | 7/2021 | Kwon | |

* cited by examiner

340

NON-VOLATILE MEMORY DEVICE AND A METHOD FOR OPERATING THE SAME

CROSS-REFERENCE TO RELATED APPLICATION

This application claims benefit of priority 35 U.S.C. § 119 to Korean Patent Application No. 10-2022-0080268, filed on Jun. 30, 2022, in the Korean Intellectual Property Office, the disclosure of which is incorporated by reference herein in its entirety.

BACKGROUND

1. Technical Field

The present disclosure relates generally to memory devices, and more particularly, to non-volatile memory devices and a method for operating the same.

2. Description of Related Art

A related vertical NAND (VNAND) may artificially generate a threshold voltage of a string select transistor via a programming operation. In this regard, as a width of distribution of the threshold voltage of the string select transistor is smaller, an operation margin of the string select transistor may be improved.

In order to narrow the distribution of the threshold voltage of the string select transistor, the string select transistor passed through read verification may need to be inhibited. However, unlike a memory cell, the string select transistor may not able to be inhibited via channel boosting, and thus may be inhibited only with bit-line voltage.

That is, the string select transistor may be inhibited by applying a high voltage to the bit-line during the program operation of the string select transistor. Thus, there exists a need for further improvements to non-volatile memory devices, such as, a non-volatile memory device capable of applying the high voltage to the bit-line, and a method for operating the same.

SUMMARY

The present disclosure provides a non-volatile memory device with improved operation margin and a method for operating the same.

According to an aspect of the present disclosure, a non-volatile memory device is provided. The non-volatile memory device includes a control logic circuit configured to generate a program signal based on a first control signal and to generate an erase signal based on a second control signal. The non-volatile memory device further includes a voltage generator configured to generate a program voltage based on the program signal received from the control logic circuit and to generate an erase voltage based on the erase signal received from the control logic circuit. The erase voltage is greater than the program voltage. The non-volatile memory device further includes a memory cell array including a memory cell, a string select transistor coupled to the memory cell, a bit-line coupled to the string select transistor, and a string select line coupled to the string select transistor. The non-volatile memory device further includes a page buffer circuit coupled to the bit-line, and including a first precharge transistor that is configured to operate based on the program signal and the erase signal. The first precharge transistor is configured to, when the string select transistor is programmed in response to the program signal, apply the program voltage to the bit-line. The program voltage is greater than an internal power voltage of the page buffer circuit. The first precharge transistor is further configured to, when the memory cell is erased in response to the erase signal, apply the erase voltage to the bit-line.

According to an aspect of the present disclosure, a non-volatile memory device is provided. The non-volatile memory device includes a first bit-line coupled to a first memory cell and a first string select transistor. The non-volatile memory device further includes a second bit-line coupled to a second memory cell and a second string select transistor. The non-volatile memory device further includes a third bit-line coupled to a third memory cell and a third string select transistor. The third bit-line is disposed between the first bit-line and the second bit-line. The non-volatile memory device further includes a first precharge circuit coupled to the first bit-line, and including a first precharge transistor that is configured to operate based on a first precharge signal. The non-volatile memory device further includes a second precharge circuit coupled to the second bit-line, and includes a second precharge transistor that is configured to operate based on a second precharge signal. The non-volatile memory device further includes a third precharge circuit coupled to the third bit-line, and includes a third precharge transistor that is configured to operate based on a third precharge signal. The non-volatile memory device further includes a first discharge circuit coupled to the first bit-line and configured to discharge a first precharge voltage applied to the first bit-line based on a first discharge signal. The non-volatile memory device further includes a second discharge circuit coupled to the second bit-line and configured to discharge a second precharge voltage applied to the second bit-line based on a second discharge signal. The non-volatile memory device further includes a third discharge circuit coupled to the third bit-line and configured to discharge a third precharge voltage applied to the third bit-line based on a third discharge signal. The control logic circuit is configured to generate the first to third precharge signals and the first to third discharge signals. The control logic circuit is further configured to turn on, during a first time period, each of the first to third precharge transistors to apply each of the first to third precharge voltages to each of the first to third bit-lines. The control logic circuit is further configured to turn off, during a second time period, each of the first precharge transistor and the second precharge transistor to bring each of the first bit-line and the second bit-line into a floating state, and maintain the third precharge transistor in a turned-on state to maintain the third bit-line in a precharged state. The control logic circuit is further configured to control, during a third time period, the first discharge circuit to discharge the first bit-line to a ground voltage, and control each of the second discharge circuit and the third discharge circuit to maintain each of the second bit-line and the third bit-line in the precharged state. The control logic circuit is further configured to apply, during a fourth time period, a program voltage to a gate electrode of each of the first to third string select transistors.

According to an aspect of the present disclosure, a method for operating a non-volatile memory device is provided. The method includes turning on each of a plurality of precharge transistors of the non-volatile memory device to precharge each of a plurality of bit-lines of the non-volatile memory device to a first voltage. The method further includes turning off first precharge transistors coupled to even-numbered bit-lines of the plurality of bit-lines among the plurality of precharge transistors, and maintaining second precharge transistors coupled to odd-numbered bit-lines of the plurality of bit-lines among the plurality of precharge transistors in a turned-on state. The method further includes discharging first bit-lines among the even-numbered bit-lines to a second voltage, and maintaining second bit-lines among the even-numbered bit-lines, and the odd-numbered bit-lines in a precharged state. The method further includes applying a program voltage to gate electrodes of string select transistors coupled to the plurality of bit-lines. The first voltage is greater than an internal power voltage of a page buffer of the non-volatile memory device.

Purposes according to the present disclosure are not limited to the above-mentioned purposes. Other purposes and advantages according to the present disclosure that are not mentioned may be understood based on following descriptions, and may be more clearly understood based on embodiments according to the present disclosure. Further, it is easily understood that the purposes and advantages according to the present disclosure may be realized using means shown in the claims and combinations thereof.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION

Figure 1:
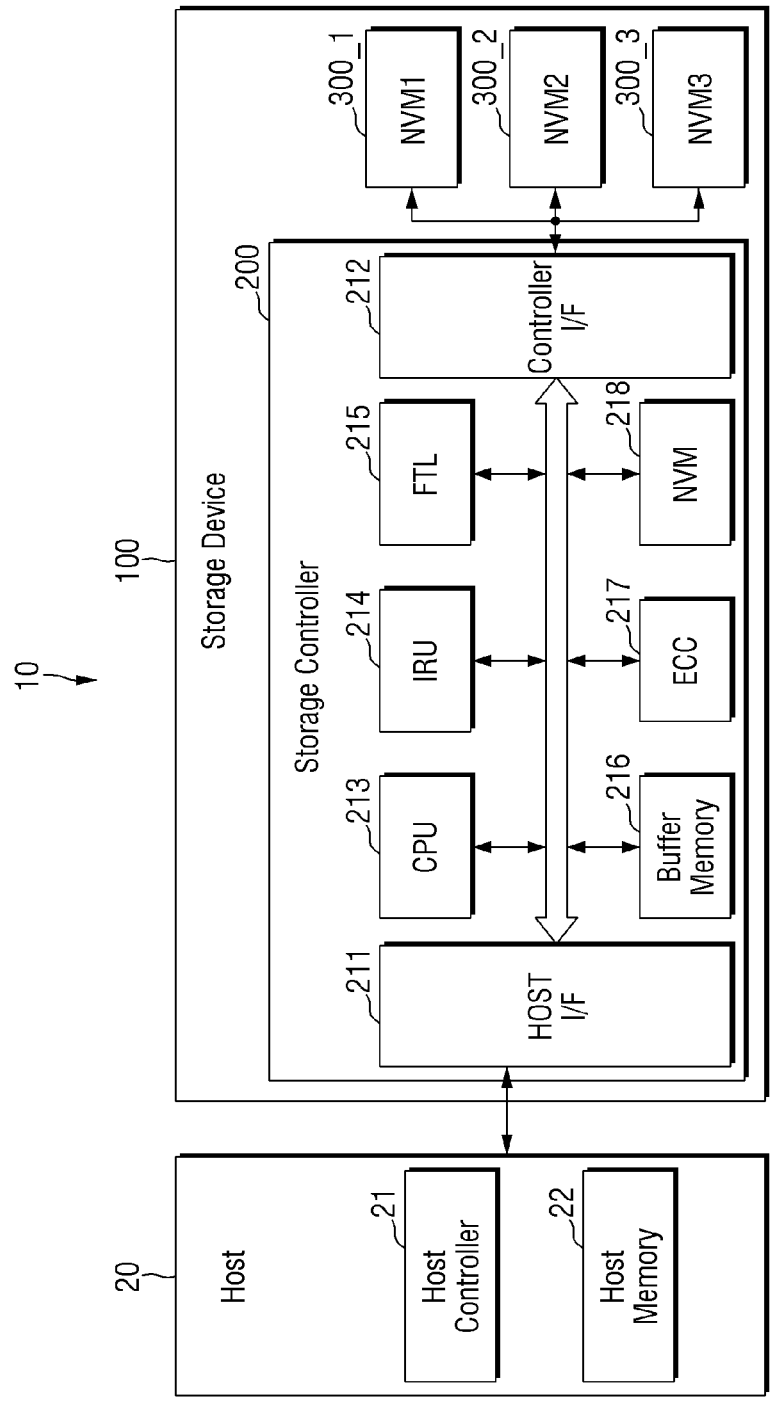
FIG. 1 is a block diagram for illustrating a storage system including a non-volatile memory device, according to some embodiments.

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art will recognize that various changes and modifications of the embodiments described herein can be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Hereinafter, with reference to the accompanying drawings, a non-volatile memory device and a method for operating the same according to some embodiments of the present disclosure are described.

FIG. 1 is a block diagram for illustrating a storage system including a non-volatile memory device according to some embodiments.

A storage system 10 may include a host 20 and a storage device 100. Further, the storage device 100 may include a storage controller 200 and a plurality of non-volatile memory devices (NVM) (e.g., 300_1, 300_2, and 300_3, hereinafter "300" generally). Further, according to an illustrative embodiment, the host 20 may include a host controller 21 and a host memory 22. The host memory 22 may function as a buffer memory for temporarily storing therein data to be transmitted to the storage device 100 and/or data transmitted from the storage device 100.

The storage device 100 may include storage media for storing data therein according to a request from the host 20. In an example, the storage device 100 may include at least one of an solid-state drive (SSD), an embedded memory, a removable external memory, and the like. When each of the non-volatile memory devices 300 is embodied as an SSD, the storage device 100 may comply with one or more memory storage standards, such as, but not limited to, a non-volatile memory express (NVMe) standard. When the non-volatile memory devices 300 are embodied as an embedded memory or an external memory, the storage device 100 may comply with one or more memory storage standards, such as, but not limited to, an universal flash storage (UFS) standard or an embedded multi-media card (eMMC) standard. Each of the host 20 and the storage device 100 may generate and/or transmit a packet according to an adopted standard protocol (e.g., transmission control protocol/internet protocol (TCP/IP)).

When each of the non-volatile memory devices 300 includes a flash memory, the flash memory may include a two-dimensional (2D) NAND memory array and/or a three-dimensional (3D) (or vertical or bonding-vertical) NAND (VNAND) memory array. In another example, the storage device 100 may include various other types of non-volatile memories. For example, the storage device 100 may include, but not be limited to, magnetic random-access memory (MRAM) ( ), spin-transfer torque (STT-MRAM), conductive bridging RAM (CBRAM), ferroelectric RAM (FeRAM or F-RAM or FRAM), phase-change RAM (PRAM or P-RAM), resistive RAM (ReRAM or RRAM), a Thyristor RAM (TRAM or T-RAM), and other various types of memories.

According to an embodiment, the host controller 21 and the host memory 22 may be implemented as separate semiconductor chips. Alternatively or additionally, in some embodiments, the host controller 21 and the host memory 22 may be integrated into the same semiconductor chip. In an example, the host controller 21 may be one of a plurality of modules included in an application processor, and the application processor may be implemented as a System on Chip (SoC). Further, the host memory 22 may be an embedded memory disposed in the application processor or a non-volatile memory and/or a memory module disposed outside the application processor.

The host controller 21 may manage an operation of storing data (e.g., write data) of the host memory 22 in the non-volatile memory devices 300, and/or accessing data (e.g., read data) stored in the non-volatile memory device 300 by the host memory 22.

The storage controller 200 may include a host interface 211, a controller interface 212 and central processing unit (CPU) ( ) 213. Further, the storage controller 200 may further include an index read unit (IRU) 214, a flash translation layer (FTL) 215, a buffer memory 216, an error correction code (ECC) engine 217, and an internal non-volatile memory 218. The storage controller 200 may further include a working memory (not shown) into which the FTL 215 is loaded. Data write and/or read operations on the non-volatile memory may be controlled by the CPU 213 executing the FTL 215.

The host interface 211 may transmit and/or receive a packet to and/or from the host 20. The packet transmitted from the host 20 to the host interface 211 may include a command and/or data to be written to the non-volatile memory device 300. The packet transmitted from the host interface 211 to the host 20 may include a response to the command and/or data read from the volatile memory devices 300. The controller interface 212 may transmit data to be written to the non-volatile memory devices 300, and/or may receive data read from the non-volatile memory devices 300. In some embodiments, the controller interface 212 may be implemented to comply with one or more memory storage standard protocols, such as, but not limited to, toggle or Open NAND Flash Interface Working Group (ONFI).

The FTL 215 may perform several functions, such as, but not limited to, address mapping, wear-leveling, and garbage collection. Further, the buffer memory 216 may temporarily store therein data to be written to the non-volatile memory devices 300 and/or data read from the non-volatile memory devices 300. The buffer memory 216 may be configured to be disposed in the storage controller 200, and/or may be disposed outside the storage controller 200.

The ECC engine 217 may perform error detection and correction functions on the data to be written to the non-volatile memory devices 300 and/or the data read from the non-volatile memory devices 300. For example, the ECC engine 217 may generate parity bits for the write data to be written to the non-volatile memory devices 300, and the generated parity bits together with the write data may be stored in the non-volatile memory devices 300. When reading the data from the non-volatile memory devices 300, the ECC engine 217 may use the parity bits read from the non-volatile memory devices 300 together with the read data to correct errors in the read data. Thus, the ECC engine 217 may output the error-corrected read data.

Figure 2:
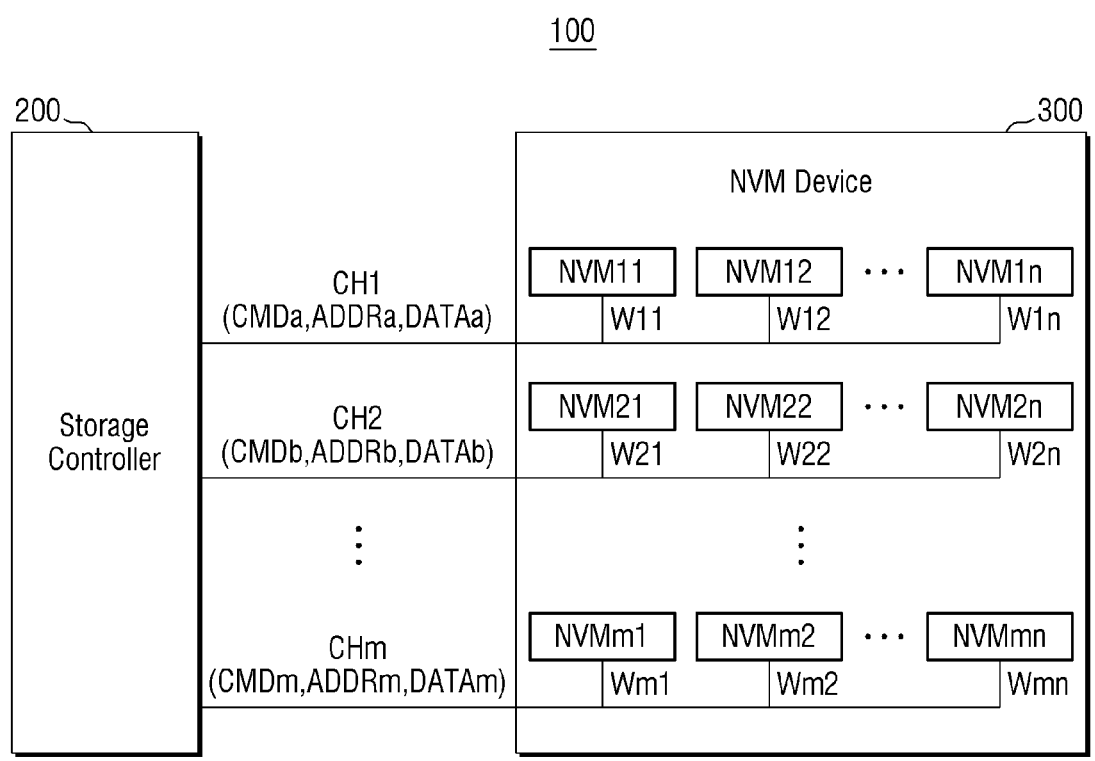
FIG. 2 is a block diagram illustrating the storage device shown in FIG. 1, according to some embodiments.

FIG. 2 is a block diagram to illustrate the storage device shown in FIG. 1.

Referring to FIG. 2, the non-volatile memory device 300 and the storage controller 200 may be connected to each other via a plurality of channels (e.g., CH1 to CHm, hereinafter "CH" generally).

The non-volatile memory device 300 may include a plurality of non-volatile memory devices (e.g., NVM11 to NVMmn). The plurality of non-volatile memory devices NVM11 to NVMmn may correspond to the non-volatile memory devices 300 in FIG. 1. That is, the non-volatile memory devices NVM11 to NVMmn of FIG. 3 may be similar to the non-volatile memory devices 300 of FIG. 1 and may include additional features not mentioned with reference to FIG. 1.

Each of the non-volatile memory devices NVM11 to NVMmn may be connected to a corresponding channel of the plurality of channels CH1 to CHm. In an illustrative embodiment, each of the non-volatile memory devices NVM11 to NVMmn may be implemented as an arbitrary memory unit that may operate in response to an individual command from the storage controller 200. For example, each of the non-volatile memory devices NVM11 to NVMmn may be implemented as a chip or a die. However, the present disclosure is not limited thereto.

The storage controller 200 may transmit and/or receive signals to and/or from the non-volatile memory devices 300 through the plurality of channels CH1 to CHm. For example, the storage controller 200 may transmit commands CMDa to CMDm, addresses ADDRa to ADDRm, and data DATAa to DATAm (e.g., data to be written) to the non-volatile memory devices 300 through the channels CH1 to CHm, respectively. Alternatively or additionally, the storage controller 200 may receive the data DATAa to DATAm (e.g., read data) from the non-volatile memory devices 300 through the channels CH1 to CHm, respectively.

The storage controller 200 may select one or more of the non-volatile memory devices 300 connected to each corresponding channel via each corresponding channel, and transmit and/or receive signals to and/or from the selected non-volatile memory devices 300.

The storage controller 200 may transmit and/or receive signals to and/or from the non-volatile memory devices 300 in a parallel manner through different channels. For example, the storage controller 200 may transmit the command CMDb to the memory device NVM21 through the second channel CH2 while transmitting the command CMDa to the memory device NVM11 through the first channel CH1. For another example, the storage controller 200 may receive the data DATAb from the memory device NVM21 through the second channel CH2 while receiving the data DATAa from the memory device NVM11 through the first channel CH1.

Figure 3:
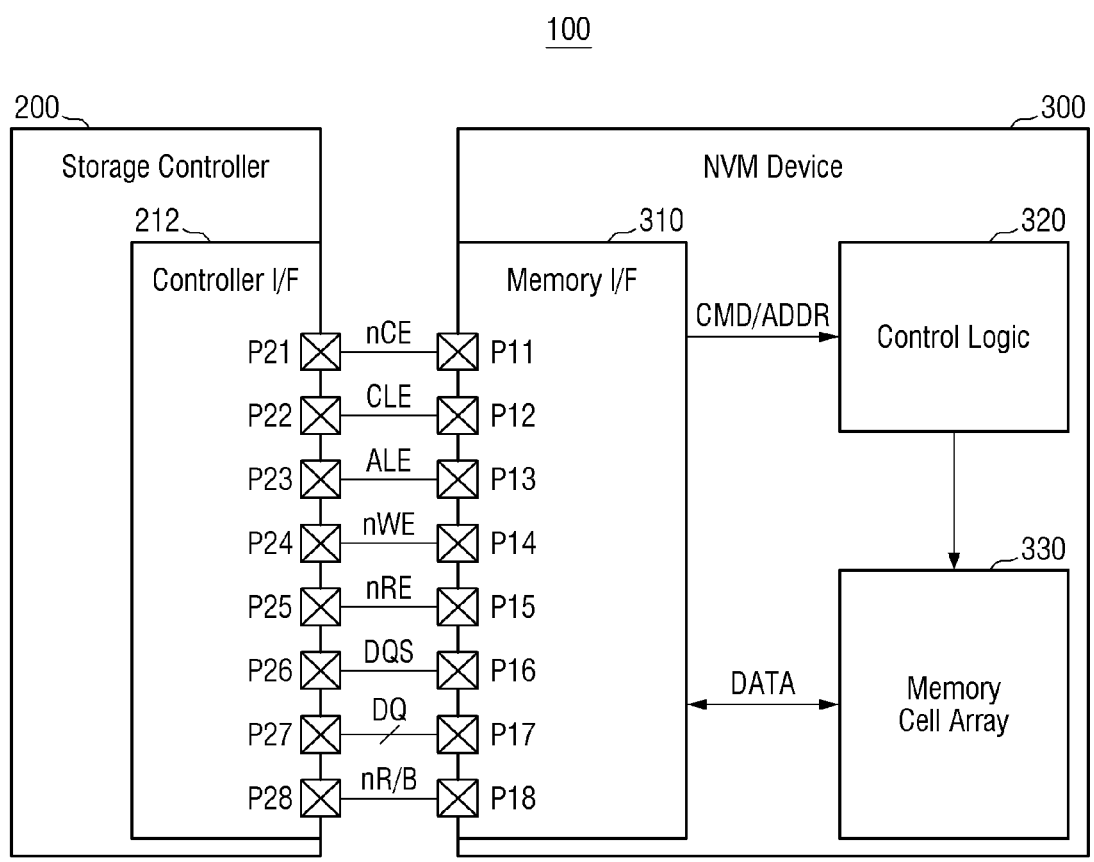
FIG. 3 is a block diagram illustrating the storage device shown in FIG. 2, according to some embodiments.

FIG. 3 is a block diagram to illustrate the storage device shown in FIG. 2.

Referring to FIG. 3, the storage device 100 may include the storage controller 200 and the non-volatile memory device 300. According to some embodiments, the non-volatile memory device 300 of FIG. 3 may correspond to one of the non-volatile memory devices NVM11 to NVMmn of FIG. 2 that communicates with the storage controller (e.g., storage controller 200 of FIG. 2) via one of the plurality of channels (e.g., channels CH1 to CHm of FIG. 2). Alternatively or additionally, the non-volatile memory device 300 of FIG. 3 may correspond to the non-volatile memory devices 300 of FIG. 1. That is, the non-volatile memory device 300 of FIG. 3 may be similar to the non-volatile memory devices NVM11 to NVMmn of FIG. 2 and/or the non-volatile memory devices 300 of FIG. 1 and may include additional features not mentioned with reference to FIGS. 1 and 2.

The non-volatile memory device 300 may include first to eighth pins (e.g., P11 to P18), a memory interface circuit 310, a control logic circuit 320, and a memory cell array 330.

The memory interface circuit 310 may receive a chip enable signal nCE from the storage controller 200 through the first pin P11. The memory interface circuit 310 may transmit and/or receive signals to and/or from the storage controller 200 through the second to eighth pins P12 to P18 in response to the chip enable signal nCE. For example, when the chip enable signal nCE is in an enable state (e.g., at a high level), the memory interface circuit 310 may transmit and/or receive signals to and/or from the storage controller 200 through the second to eighth pins P12 to P18.

The memory interface circuit 310 may receive, from the storage controller 200, a command latch enable signal CLE through the second pin P12, an address latch enable signal ALE through the third pin P13, and a write enable signal nWE through the fourth pin P14. The memory interface circuit 310 may receive a data signal DQ from the storage controller 200 and/or transmit the data signal DQ to the storage controller 200 through the seventh pin P17. A command CMD, an address ADDR, and/or data DATA may be transmitted in the data signal DQ. For example, the data signal DQ may be transmitted through a plurality of data signal lines. In this case, the seventh pin P17 may include a plurality of pins corresponding to the plurality of data signals DQ.

The memory interface circuit 310 may acquire the command CMD from the data signal DQ received for an enable period (e.g., a high level state) of the command latch enable signal CLE based on toggle timings of the write enable signal nWE. The memory interface circuit 310 may acquire the address ADDR from the data signal DQ received for the enable period (e.g., a high level state) of the address latch enable signal ALE, based on the toggle timings of the write enable signal nWE.

In an illustrative embodiment, the write enable signal nWE may maintain a static state (e.g., at a high level or at a low level), and then may toggle between a high level and a low level. For example, the write enable signal nWE may toggle for a period for which the command CMD or the address ADDR is transmitted. Accordingly, the memory interface circuit 310 may acquire the command CMD or the address ADDR based on the toggle timings of the write enable signal nWE.

The memory interface circuit 310 may receive the read enable signal nRE from the storage controller 200 through the fifth pin P15. The memory interface circuit 310 may receive a data strobe signal DQS from the storage controller 200 through the sixth pin P16 and/or may transmit the data strobe signal DQS to the storage controller 200.

In a data DATA output operation of the non-volatile memory device 300, the memory interface circuit 310 may receive a toggling read enable signal nRE through the fifth pin P15 before outputting the data DATA. The memory interface circuit 310 may generate the data strobe signal DQS toggling based on the toggling of the read enable signal nRE. For example, the memory interface circuit 310 may generate the data strobe signal DQS that starts toggling after a predetermined delay (e.g., tDQSRE) from a toggling start time of the read enable signal nRE. The memory interface circuit 310 may transmit the data signal DQ including the data DATA based on the toggle timing of the data strobe signal DQS. Accordingly, the data DATA may be transmitted to the storage controller 200 based on the toggle timing of the data strobe signal DQS.

In a data DATA input operation of non-volatile memory device 300, when the data signal DQ including the data DATA is received from the storage controller 200, the memory interface circuit 310 may receive the toggling data strobe signal DQS together with the data DATA from the storage controller 200. The memory interface circuit 310 may acquire the data DATA from the data signal DQ based on the toggle timing of the data strobe signal DQS. For example, the memory interface circuit 310 may acquire the data DATA by sampling the data signal DQ at a rising edge and/or a falling edge of the data strobe signal DQS.

The memory interface circuit 310 may transmit a ready/busy output signal nR/B to the storage controller 200 through the eighth pin P18. The memory interface circuit 310 may transmit state information of the non-volatile memory device 300 to the storage controller 200 using the ready/busy output signal nR/B. When the non-volatile memory device 300 is in the busy state (that is, when internal operations of the non-volatile memory device 300 are being performed), the memory interface circuit 310 may transmit the ready/busy output signal nR/B indicating the busy state to the storage controller 200. When the non-volatile memory device 300 is in the ready state (that is, when the internal operations of the non-volatile memory device 300 are not performed or are completed, and/or when the non-volatile memory device 300 is in an idle state), the memory interface circuit 310 may transmit the ready/busy output signal nR/B indicating the ready state to the storage controller 200. For example, while the non-volatile memory device 300 reads out the data DATA from the memory cell array 330 in response to a page readout command, the memory interface circuit 310 may transmit the ready/busy output signal nR/B indicating the busy state (e.g., a low level) to the storage controller 200. For another example, while the non-volatile memory device 300 programs the data DATA into the memory cell array 330 in response to a program command, the memory interface circuit 310 may transmit the ready/busy output signal nR/B indicating the busy state to the storage controller 200.

The control logic circuit 320 may generally control various operations of the non-volatile memory device 300. The control logic circuit 320 may receive the obtained command/address CMD/ADDR from the memory interface circuit 310. The control logic circuit 320 may generate control signals for controlling other components of the non-volatile memory device 300 in response to the received command/address CMD/ADDR. For example, the control logic circuit 320 may generate various control signals for programming the data DATA into the memory cell array 330 and/or for reading out the data DATA from the memory cell array 330. Alternatively or additionally, control signals for adjusting a channel potential in the memory cell array may be generated by the control logic circuit 320.

The memory cell array 330 may store therein the data DATA obtained from the memory interface circuit 310 under control of the control logic circuit 320. The memory cell array 330 may output the stored data DATA to the memory interface circuit 310 under the control of the control logic circuit 320. Further, the channel potential in the memory cell array 330 may be adjusted under the control of the control logic circuit 320.

The memory cell array 330 may include a plurality of memory cells. For example, each of the plurality of memory cells may be embodied as a flash memory cell. However, the present disclosure is not limited thereto, and each of the memory cells may be embodied as various types of memory cells, such as, but not limited to, a RRAM cell, a FRAM cell, a PRAM cell, a TRAM cell, and/or a MRAM cell. Hereinafter, embodiments are described based on an example in which the memory cells are embodied as NAND flash memory cells.

The storage controller 200 may include first to eighth pins (e.g., P21 to P28), and the controller interface 212. The first to eighth pins P21 to P28 may correspond to the first to eighth pins P11 to P18 of the non-volatile memory device 300.

The controller interface 212 may transmit the chip enable signal nCE to the non-volatile memory device 300 through the first pin P21. The controller interface 212 may transmit and/or receive signals to and/or from the non-volatile memory device 300 selected using the chip enable signal nCE through the second to eighth pins P22 to P28.

The controller interface 212 may transmit, to the non-volatile memory device 300, the command latch enable signal CLE through the second pin P22, the address latch enable signal ALE through the third pin P23, and the write enable signal nWE through the fourth pin P24. The controller interface 212 may transmit the data signal DQ to the non-volatile memory device 300 and/or receive the data signal DQ from the non-volatile memory device 300 through the seventh pin P27.

The controller interface 212 may transmit the data signal DQ including the command CMD and/or the address ADDR together with a toggling write enable signal nWE to the non-volatile memory device 300. As the controller interface 212 transmits the command latch enable signal CLE having an enable state, the controller interface 212 may transmit the data signal DQ including the command CMD to the non-volatile memory device 300. As the controller interface 212 transmits the address latch enable signal ALE having an enable state, the controller interface 212 may transmit the data signal DQ including the address ADDR to the non-volatile memory device 300.

The controller interface 212 may transmit the read enable signal nRE to the non-volatile memory device 300 through the fifth pin P25. The controller interface 212 may receive the data strobe signal DQS from the non-volatile memory device 300 through the sixth pin P26 and/or may transmit the data strobe signal DQS to the non-volatile memory device 300 through the sixth pin P26.

In the data DATA output operation of the non-volatile memory device 300, the controller interface 212 may generate a toggling read enable signal nRE and/or transmit the read enable signal nRE to the non-volatile memory device 300. For example, the controller interface 212 may generate the read enable signal nRE that is changed from a static state (e.g., at a high level or at a low level) to a toggle state, before the data DATA is output. Accordingly, the data strobe signal DQS toggling based on the read enable signal nRE may be generated in the non-volatile memory device 300. The controller interface 212 may receive the data signal DQ including the data DATA together with the toggling data strobe signal DQS from the non-volatile memory device 300. The controller interface 212 may acquire the data DATA from the data signal DQ based on the toggle timing of the data strobe signal DQS.

In the data DATA input operation of the non-volatile memory device 300, the controller interface 212 may generate a toggling data strobe signal DQS. For example, the controller interface 212 may generate a data strobe signal DQS that is changed from a static state (e.g., a high level or a low level) to a toggle state, before transmitting the data DATA. The controller interface 212 may transmit the data signal DQ including the data DATA to the non-volatile memory device 300 based on the toggle timings of the data strobe signal DQS.

The controller interface 212 may receive the ready/busy output signal nR/B from the non-volatile memory device 300 through the eighth pin P28. The controller interface 212 may determine state information of the non-volatile memory device 300 based on the ready/busy output signal nR/B.

Figure 4:
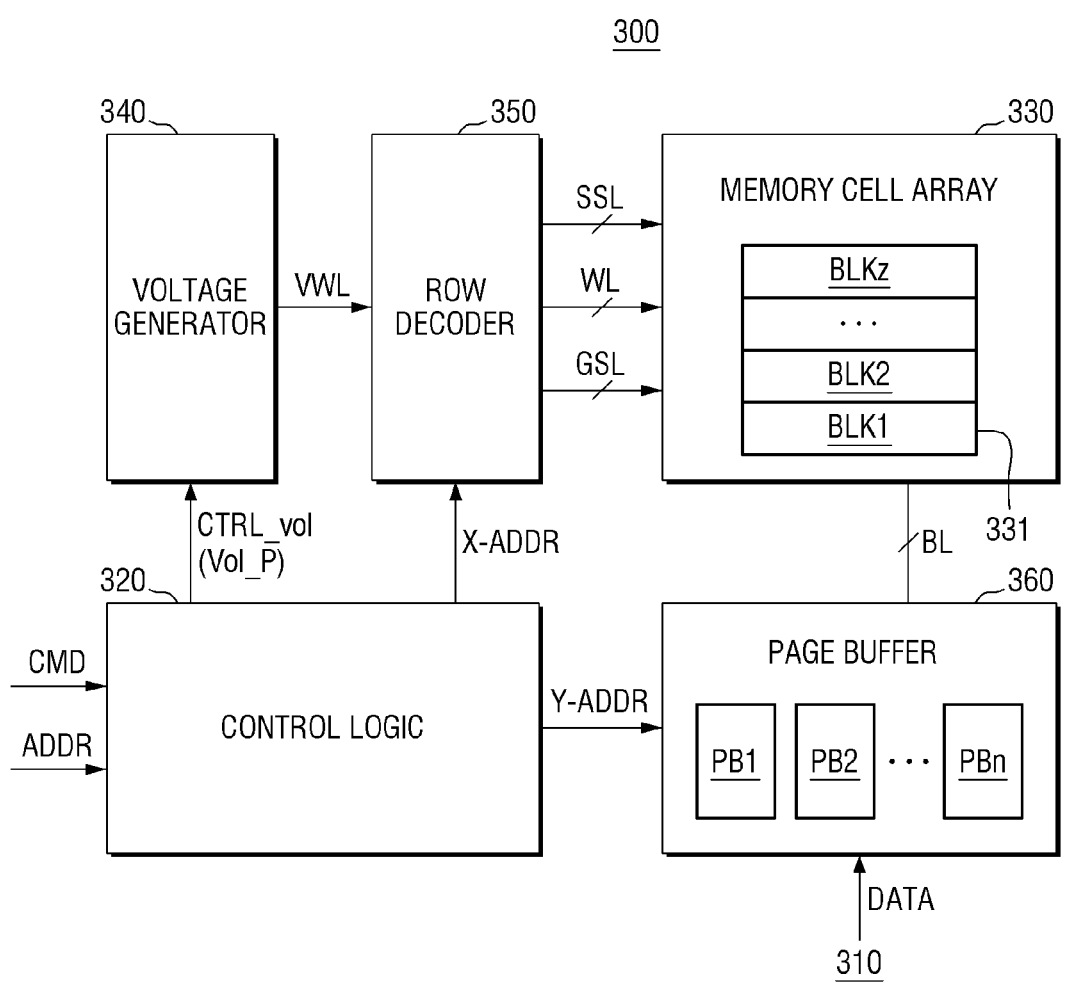
FIG. 4 is a block diagram illustrating the non-volatile memory device of FIG. 1, according to some embodiments.

FIG. 4 is a block diagram to illustrate the non-volatile memory device of FIG. 1.

Referring to FIG. 4, the non-volatile memory device 300 may include the control logic circuit 320, the memory cell array 330, a page buffer 360, a voltage generator 340, and a row decoder 350. The non-volatile memory device 300 may further include the memory interface circuit (e.g., memory interface circuit 310 in FIG. 3). In addition, a column logic, a pre-decoder, a temperature sensor, a command decoder, an address decoder, and the like may be further included in the non-volatile memory device 300 (not shown). The non-volatile memory device 300 of FIG. 4 may correspond to the non-volatile memory devices 300 of FIGS. 1-3. That is, the non-volatile memory device 300 of FIG. 4 may be similar to the non-volatile memory device 300 of FIG. 3, the non-volatile memory devices NVM11 to NVMmn of FIG. 2, and/or the non-volatile memory devices 300 of FIG. 1 and may include additional features not mentioned with reference to FIGS. 1-3.

The control logic circuit 320 may control various operations in the non-volatile memory device 300. For example, the control logic circuit 320 may output the various control signals in response to the command CMD and/or the address ADDR from the memory interface circuit 310. For another example, the control logic circuit 320 may output a voltage control signal CTRL_vol, a row address X-ADDR, and a column address Y-ADDR. The voltage control signal CTRL_ vol may include a program signal and/or an erase signal.

The memory cell array 330 may include a plurality of memory blocks BLK1 to BLKz, where z is a positive integer. Each of the plurality of memory blocks BLK1 to BLKz may include a plurality of memory cells. The memory cell array 330 may be connected (e.g., coupled) to the page buffer 360 through bit-lines BL, and may be connected (e.g., coupled) to the row decoder 350 through word-lines WL, string select lines SSL, and ground select lines GSL.

In an illustrative embodiment, the memory cell array 330 may include a three-dimensional memory cell array. The three-dimensional memory cell array may include a plurality of NAND strings. Each NAND string may include memory cells respectively connected to the word-lines stacked vertically on the substrate. In another illustrative embodiment, the memory cell array 330 may include a two-dimensional memory cell array. The two-dimensional memory cell array may include a plurality of NAND strings arranged along row and column directions.

The page buffer 360 may include a plurality of page buffers PB1 to PBn, where n is an integer greater than 2. The plurality of page buffers PB1 to PBn may be respectively connected to the memory cells through a plurality of bit-lines BL. The page buffer 360 may select at least one bit-line from among the bit-lines BL in response to the column address Y-ADDR. The page buffer 360 may act as a write driver and/or a sensing amplifier depending on an operation mode. For example, during a program operation, the page buffer 360 may apply a bit-line voltage corresponding to data to be programmed to a selected bit-line. During a read operation, the page buffer 360 may detect a current or voltage of the selected bit-line and thus detect data stored in the memory cell based on the detected current or voltage.

The voltage generator 340 may generate various types of voltages for performing program, read, and/or erase operations, based on the voltage control signal CTRL_vol. For example, the voltage generator 340 may generate a program voltage, a read voltage, a program verification voltage, an erase voltage, and the like, as the word-line voltage VWL.

The row decoder 350 may select one of the plurality of word-lines WL in response to the row address X-ADDR, and may select one of the plurality of string select lines SSL in response to the row address X-ADDR. For example, during a program operation, the row decoder 350 may apply the program voltage and the program verification voltage to the selected word-line. During a read operation, the row decoder 350 may apply the read voltage to the selected word-line.

Figure 5:
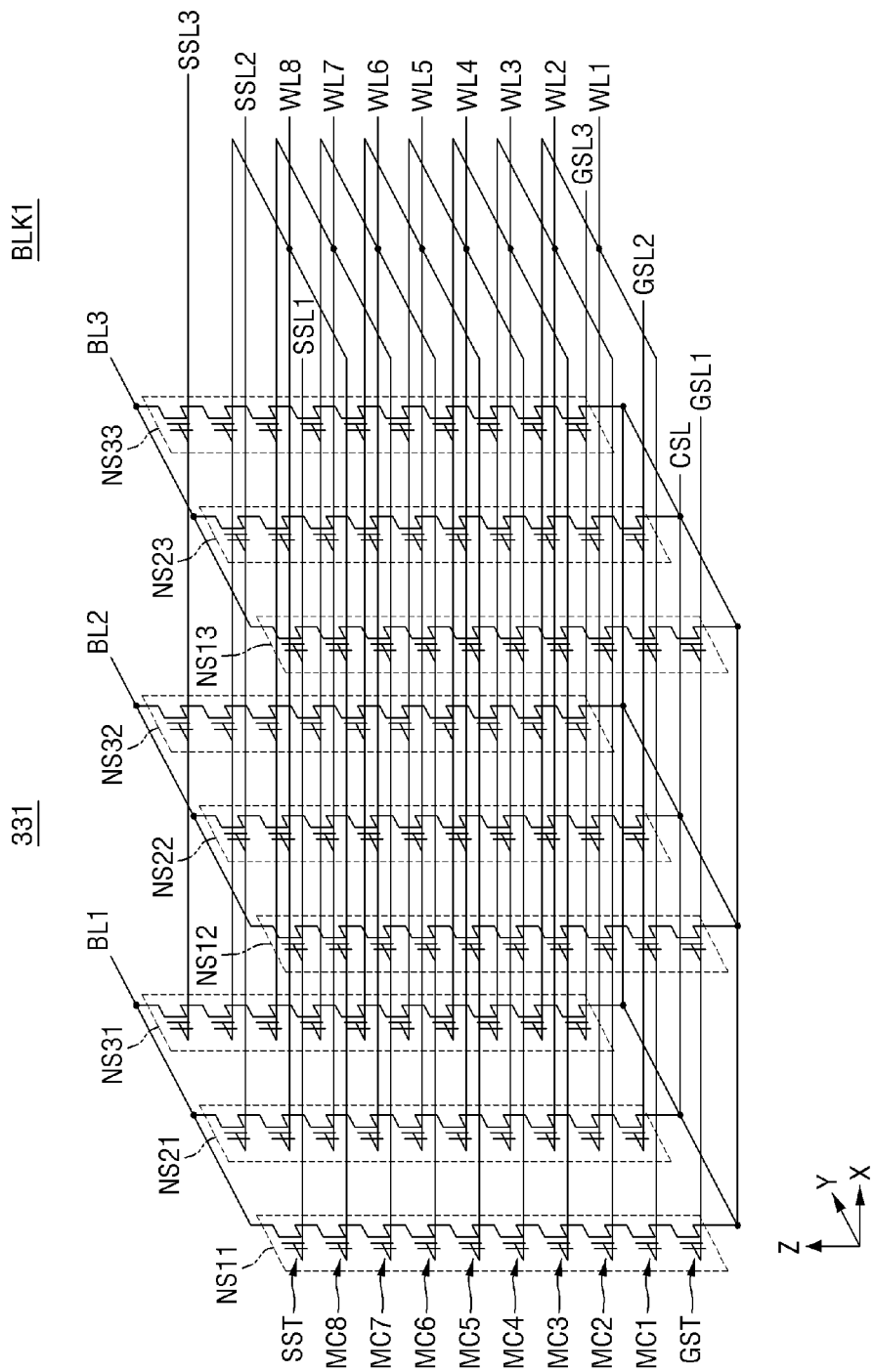
FIG. 5 is an illustrative circuit diagram for illustrating the memory block of FIG. 4, according to some embodiments.

FIG. 5 is an illustrative circuit diagram for illustrating the memory block of FIG. 4.

Referring to FIG. 5, cell strings (e.g., NS11 to NS33) may be disposed between bit-lines (e.g., BL1 to BL3) and a common source line CSL. Each cell string (e.g., NS11) may include a ground select transistor GST, a plurality of memory cells (e.g., MC1 to MC8), and a string select transistor SST.

The string select transistor SST may be connected to a string select line SSL. The string select line SSL may be split into first to third string select lines (e.g., SSL1 to SSL3). The ground select transistor GST may be connected to ground select lines (e.g., GSL1 to GSL3). In some embodiments, the ground select lines GSL1 to GSL3 may be connected to each other. The string select transistor SST may be connected to the bit-line BL, and/or the ground select transistor GST may be connected to the common source line CSL.

The plurality of memory cells MC1 to MC8 may be connected to corresponding word-lines WL1 to WL8, respectively. A set of memory cells connected to one word-line and programmed simultaneously may be referred to as a page. The memory block BLK1 may include a plurality of pages as shown. Further, the plurality of pages may be connected to one word-line.

The data of the memory block BLK1 may be programmed (e.g., written) and/or read on a page basis. The data may be erased on a memory block BLK1 basis. That is, when the non-volatile memory device performs a program and/or read operation, the data may be programmed and/or read on a page basis. When the non-volatile memory device performs an erase operation, the data may be erased on a memory block basis. That is, data stored in the memory cells MC1 to MC8 included in one memory block may be erased at once.

In one example, each of the memory cells MC1 to MC8 may store therein one bit of data and/or two or more bits of data. Each of the memory cells MC1 to MC8 may be embodied as, for example, a single level cell (SLC) memory in which one bit of data is recorded in one memory cell, and/or a multi-level cell (MLC) memory in which two or more bits of data are recorded in one memory cell. The multi-level cell may be embodied as, for example, a triple level cell (TLC) in which 3 bits of data are recorded in one memory cell and/or a quadruple level cell (QLC) in which 4 bits of data are recorded in one memory cell.

Figure 6:
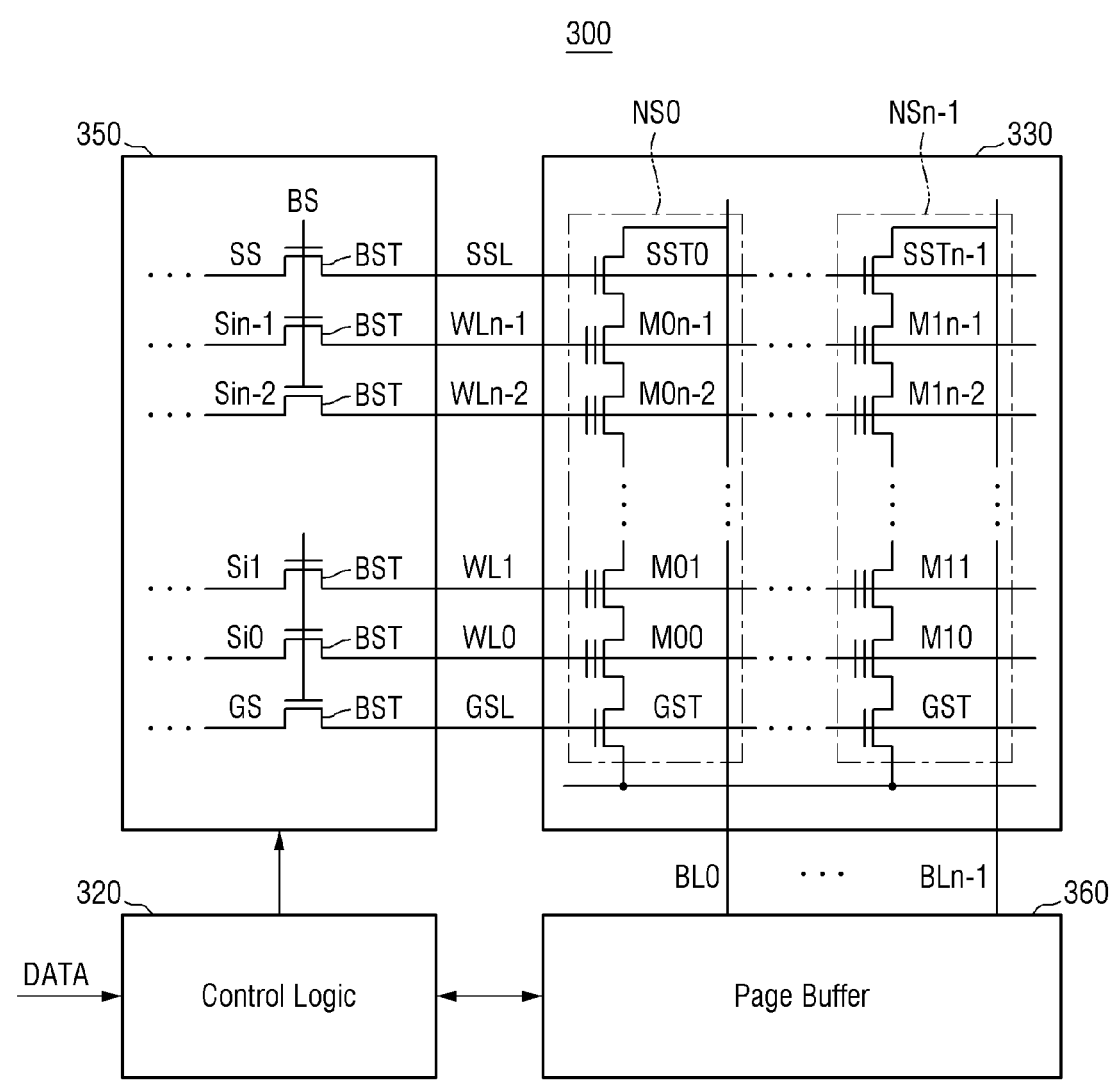
FIG. 6 is an illustrative block diagram for illustrating a non-volatile memory device, according to some embodiments.

FIG. 6 is an illustrative block diagram for illustrating a non-volatile memory device according to some embodiments.

The non-volatile memory device 300 of FIG. 6 may correspond to the non-volatile memory devices 300 of FIGS. 1-4. That is, the non-volatile memory device 300 of FIG. 6 may be similar to the non-volatile memory device 300 of FIG. 4, the non-volatile memory device 300 of FIG. 3, the non-volatile memory devices NVM11 to NVMmn of FIG. 2, and/or the non-volatile memory devices 300 of FIG. 1 and may include additional features not mentioned with reference to FIGS. 1-4.

Referring to FIG. 6, the non-volatile memory device 300 may include the control logic circuit 320, the row decoder 350, the memory cell array 330, and the page buffer 360. Rows of the memory cell array 330 may be driven by the row decoder 350, while columns thereof may be driven by the page buffer 360. The row decoder 350 and the page buffer 360 may be driven by the control logic circuit 320.

The memory cell array 330 may include a plurality of memory cells M00 to M1$n$-1. The memory cell blocks may be arranged in two dimensions, and may be stacked in a three-dimensional manner. Each memory cell block may include a plurality of memory cell strings NS0 to NSn-1. Each of the cell strings NS0 to NSn-1 may include a plurality of memory cells M00 to M1$n$-1. Channels of the memory cells M00 to M1$n$-1 of each of the cell strings NS0 to NSn-1 may be disposed between and be connected in series with a channel of a plurality of string select transistors SST: SST0 to SSTn-1 and a channel of a ground select transistor GST.

Each block of the memory cell array 330 may include a string select line SSL, a ground select line GSL, a plurality of word-lines WL0 to WLn-1, and a plurality of bit-lines BL0 to BLn-1. The string select line may be commonly connected to gates of the plurality of string select transistors SST0 to SSTn-1. The plurality of word-lines WL0 to WLn−1 may be respectively connected to control gates of corresponding cells of a plurality of memory cells M00 to M1n−1 of each of the cell strings NS0 to NSn−1. The ground select line GSL may be commonly connected to gates of the plurality of ground select transistors GST. The ground select line GSL, the plurality of word-lines WL0 to WLn−1, and the string select line SSL may receive corresponding select signals GS, Si0 to Sin−1, and SS through corresponding block select transistors BST, respectively. The block select transistors BST may be included in the row decoder 350 and may be connected to each other so as to be commonly controlled by a block control signal BS.

The row decoder 350 may select one word-line from among the plurality of word-lines WL0 to WLn−1 based on row address information. The row decoder 350 may supply word-line voltages based on each operation mode to selected word-lines and unselected word-lines. For example, the row decoder 350 may supply a program voltage to a selected word-line and a pass voltage to an unselected word-line in a program operation mode. The row decoder 350 may supply ground voltage GND to the selected word-line and read voltage to unselected word-lines in a read operation mode. To this end, the row decoder 350 may receive the select signals Si0 to Sin−1 from a word-line driver. Then, the row decoder 350 may provide a word-line voltage to word-lines WL0 to WLn−1 corresponding to the input select signals Si0 to S1n−1. The select signals Si0 to Sin−1 may have a voltage level corresponding to at least one of the program voltage, the pass voltage, or the read voltage. Then, the row decoder 350 may provide the word-line voltage to the word-lines WL0 to WLn−1 corresponding to the select signals Si0 to Sin−1.

The plurality of bit-lines BL0 to BLn−1 arranged on the memory cell array 330 may be connected to the page buffer 360. The page buffer 360 may provide corresponding page buffer data to the plurality of bit-lines BL0 to BLn−1, respectively. Each page buffer may be implemented to share a pair of bit-lines. The page buffer 360 may supply a power voltage or a ground voltage to the plurality of bit-lines BL0 to BLn−1 based on data to be programmed in the program operation mode. The page buffer 360 may detect data from the selected memory cells through the plurality of bit-lines BL0 to BLn−1 in the read/verification operation mode. In a sensing operation of the page buffer 360, whether a memory cell is a programmed cell or an erased cell may be identified.

The row decoder 350 and/or the page buffer 360 may be controlled using the control logic circuit 320 so as to activate the word-lines WL0 to WLn−1 and/or the bit-lines BL0 to BLn−1 connected to the memory cell array 330. The control logic circuit 320 may receive data from the storage controller 200 of FIG. 1. However, the present disclosure is not limited thereto.

In some embodiments, the memory cell array 330 may be implemented so as to have a two-dimensional structure and/or a three-dimensional structure. An embodiment in which the memory cell array 330 is implemented so as to have a three-dimensional structure is described hereinafter.

Figure 7:
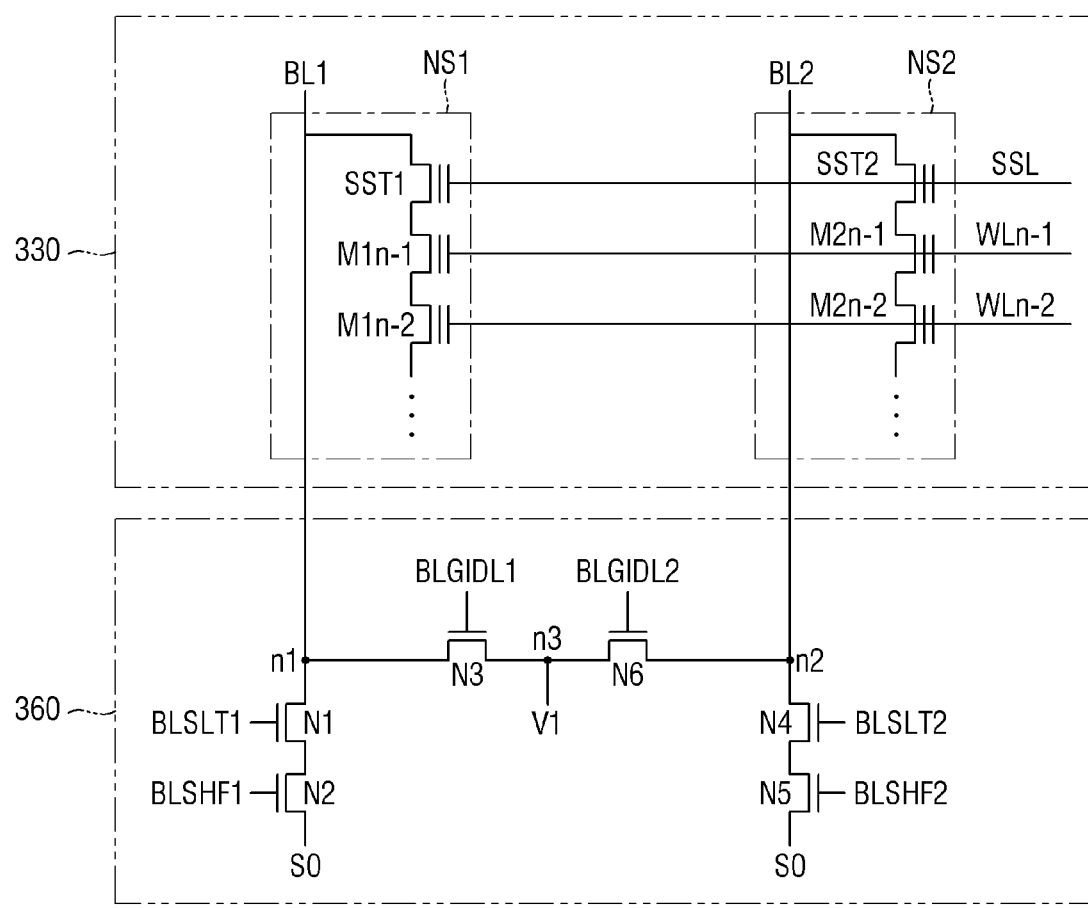
FIG. 7 is a circuit diagram for illustrating a memory cell array and a page buffer, according to some embodiments.

FIG. 7 is a circuit diagram for illustrating a memory cell array and a page buffer according to some embodiments.

Referring to FIG. 7, the memory cell array 330 may include the bit-lines BL1 and BL2, the string select transistors SST1 and SST2, and the memory cells M1n−1, M1n−2, M2n−1, and M2n−2. Although FIG. 7 shows only some of the plurality of bit-lines, some of the plurality of string select transistors, and some of the plurality of memory cells, the number of the bit-lines, the number of the string select transistors, and the number of the memory cells may be much larger than those as shown in FIG. 7.

The string NS1 may include the bit-line BL1, the string select transistor SST1, the memory cells M1n−1 and M1n−2. The cell string NS2 may include the bit-line BL2, the string select transistor SST2, and the memory cells M2n−1 and M2n−2.

Gate electrodes of the string select transistor SST1 and the string select transistor SST2 may be commonly connected to the string select line SSL. Gate electrodes of the memory cell M1n−1 and the memory cell M2n−1 may be commonly connected to the word line WLn−1. Gate electrodes of the memory cell M1n−2 and the memory cell M2n−2 may be commonly connected to the word line WLn−2.

The page buffer 360 may include discharge transistors N1, N2, N4, and N5 and precharge transistors N3 and N6.

Internal power voltage of the page buffer 360 may be applied to a node S0 of the page buffer 360.

One end of the discharge transistor N1 may be connected to a node n1. The node n1 may be connected to one end of the string select transistor SST1. The other end of the discharge transistor N1 may be connected to one end of the discharge transistor N2. The other end of the discharge transistor N2 may be connected to a node S0.

One end of the precharge transistor N3 may be connected to the node n1. The other end of the precharge transistor N3 may be connected to a node n3. One end of the precharge transistor N6 may be connected to a node n3. Voltage V1 may be applied to the node n3. In some embodiments, the voltage V1 may be generated from the voltage generator (e.g., voltage generator 340 of FIG. 4) and then may be provided to the node n3. An operation in which the voltage V1 is generated is described with reference to FIG. 8.

The other end of the precharge transistor N6 may be connected to a node n2. One end of the discharge transistor N4 may be connected to the node n2. The node n2 may be connected to one end of the string select transistor SST2. The other end of the discharge transistor N4 may be connected to one end of the discharge transistor N5. The other end of the discharge transistor N5 may be connected to the node S0.

In some embodiments, discharge signals BLSLT1, BLSHF1, BLSLT2, and BLSHF2 for controlling the discharge transistors N1, N2, N4, and N5 and precharge signals BLGIDL1 and BLGIDL2 for controlling the precharge transistors N3 and N6 may be generated from the control logic (e.g., control logic circuit 320 of FIG. 6). However, embodiments are not limited thereto.

The discharge transistor N1 may operate depending on whether the discharge signal BLSLT1 is applied thereto. The discharge transistor N2 may operate depending on whether the discharge signal BLSHF1 is applied thereto. For example, the discharge transistor N1 may be turned on in response to the discharge signal BLSLT1, and the discharge transistor N2 may be turned on in response to the discharge signal BLSHF1 to discharge voltage of the bit-line BL1.

The precharge transistor N3 may operate depending on whether the precharge signal BLGIDL1 is applied thereto. For example, the precharge transistor N3 may be turned on in response to the precharge signal BLGIDL1 to precharge the bit-line BL1 to the voltage V1.

The discharge transistor N4 may operate depending on whether the discharge signal BLSLT2 is applied thereto. The discharge transistor N5 may operate depending on whether the discharge signal BLSHF2 is applied thereto. For example, the discharge transistor N4 may be turned on in response to the discharge signal BLSLT2, and the discharge transistor N5 may be turned on in response to the discharge signal BLSHF2 to discharge the voltage of the bit-line BL2.

The precharge transistor N6 may operate depending on whether the precharge signal BLGIDL2 is applied thereto. For example, the precharge transistor N6 may be turned on in response to the precharge signal BLGIDL2 to precharge the bit-line BL2 to the voltage V1.

Figure 8:
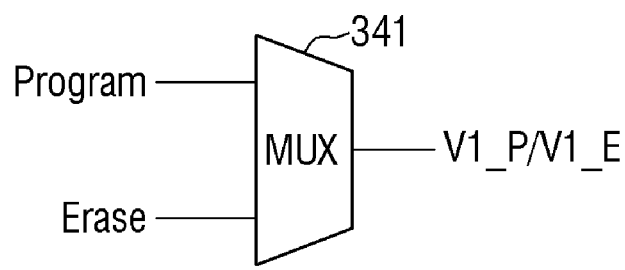
FIG. 8 is an illustrative view of the voltage generator shown in FIG. 4, according to some embodiments.

FIG. 8 is an illustrative view of the voltage generator shown in FIG. 4.

Referring to FIG. 8, the voltage generator 340 may include a multiplexer 341.

Referring to FIG. 4 and FIG. 8, the control logic circuit 320 may receive a control signal from an external source and generate a program signal and/or an erase signal based on the control signal. In this regard, the program signal may be a signal for programming the string select transistor for generation of threshold voltage distribution of the string select transistor and/or for programming data into the memory cell. The erase signal may be a signal for erasing data stored in the memory cell.

When the voltage generator 340 receives the program signal from the control logic circuit 320, the multiplexer 341 may be set to a state 1 (e.g., a high level). When the multiplexer 341 is set to the state 1, the multiplexer 341 may output a program voltage V1_P. A magnitude of the program voltage V1_P may be, for example, 5V. However, an embodiment is not limited thereto, and the magnitude of the program voltage V1_P generated by the multiplexer 341 may vary according to an embodiment.

When the voltage generator 340 receives the erase signal from the control logic circuit 320, the multiplexer 341 may be set to a state 0 (e.g., a low level). When the multiplexer 341 is set to the state 0, the multiplexer 341 may output an erase voltage V1_E. A magnitude of the erase voltage V1_E may be, for example, 18V. However, an embodiment is not limited thereto, and the magnitude of the erase voltage V1_E generated by the multiplexer 341 may vary according to an embodiment.

The generated program voltage V1_P and the generated erase voltage V1_E may be provided, in a form of the voltage V1, to a node (e.g., n3 in FIG. 7) of the page buffer (e.g., page buffer 360 in FIG. 7).

Figure 9:
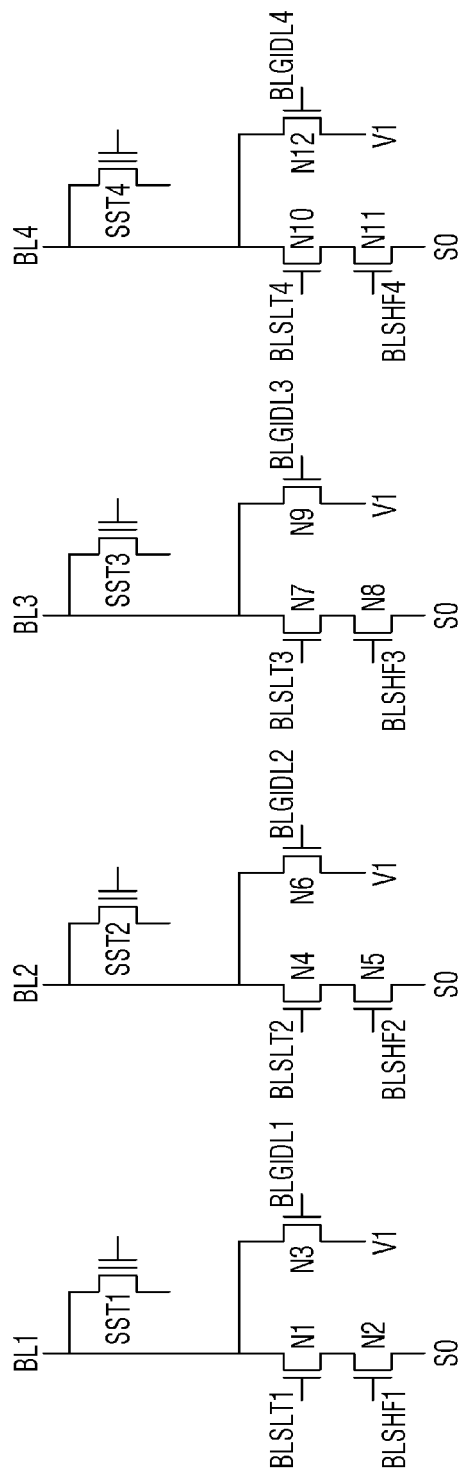
FIG. 9 is an illustrative circuit diagram showing a plurality of bit-lines including odd-numbered bit-lines and even-numbered bit-lines, according to some embodiments.

FIG. 9 is an illustrative circuit diagram showing a plurality of bit-lines including odd-numbered bit-lines and even-numbered bit-lines.

Bit-lines BL1 to BL4 as shown in FIG. 9 may be of a form in which a plurality of bit-lines BL1 and BL2 as described with reference to FIG. 7 are arranged.

Referring to FIG. 9, among the plurality of bit-lines, each of the bit-line BL1 and the bit-line BL3 may be an odd-numbered bit-line, while each of the bit-line BL2 and the bit-line BL4 may be an even-numbered bit-line.

When string select transistors SST1 to SST4 respectively connected to the bit-lines BL1 to BL4 are programmed, a bit-line adjacent to a discharged bit-line may be unexpectedly discharged due to the discharged bit-line. This may be referred to as a couple-down phenomenon. Thus, in order to prevent the couple-down phenomenon, in accordance with this embodiment, the program operation may be individually performed on an even-numbered bit-line group and an odd-numbered bit-line group.

Hereinafter, with reference to FIG. 10 to FIG. 17, the program operation according to some embodiments is described.

Figure 10:
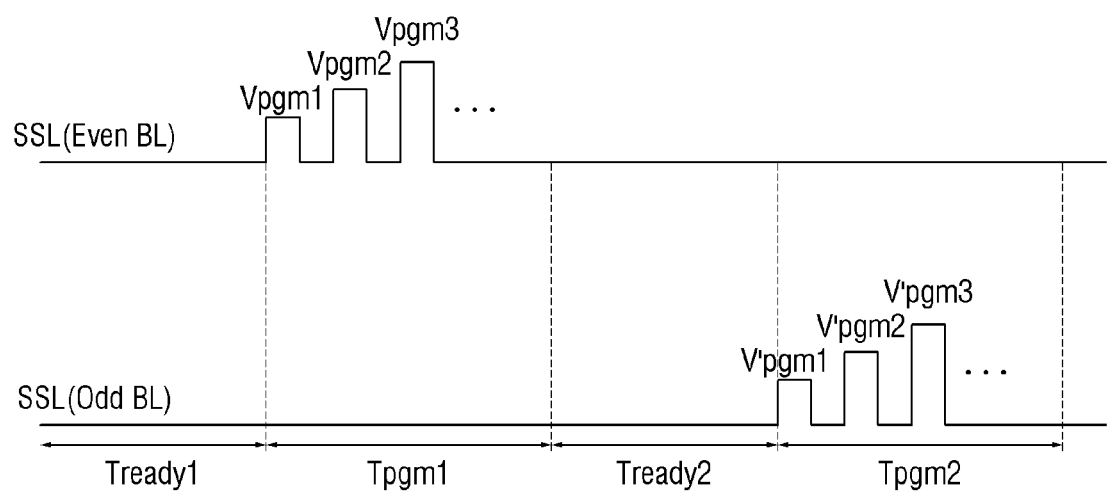
FIG. 10 is a timing diagram specifying a scheme in which a program voltage is applied to a gate electrode of a string select transistor, according to some embodiments.

FIG. 10 is a timing diagram specifying a scheme in which a program voltage is applied to a gate electrode of a string select transistor according to some embodiments.

Referring to FIG. 10, in some embodiments, the program operation on the string select transistor connected to the even-numbered bit-line may be first performed, and then the program operation on the string select transistor connected to the even-numbered bit-line may have been completed, and then, a program operation may be performed on the string select transistor connected to the odd-numbered bit-line.

After a program ready operation is performed on the even-numbered bit-line and the odd-numbered bit-line during a first program ready time Tready1, a program operation on the string select transistor connected to the even-numbered bit-line may be performed during a first program time Tpgm1. The program ready operation performed during the first program ready time Tready1 is described with reference to FIG. 11.

In this embodiment, program voltages Vpgm1 to Vpgm3 may be applied to a gate electrode of the string select transistor connected to the even-numbered bit-line through the string select line SSL in an incremental step pulse program (ISPP) scheme. For example, a magnitude of the program voltage Vpgm3 may be greater than a magnitude of the program voltage Vpgm2, and the magnitude of the program voltage Vpgm2 may be greater than a magnitude of the program voltage Vpgm1.

Although FIG. 10 shows only a manner in which the magnitude is gradually increased, embodiments are not limited to the illustrated example.

After the program operation on the string select transistor connected to the even-numbered bit-line has been completed, a program ready operation may be performed on the even-numbered bit-line and the odd-numbered bit-line during a second program ready time Tready2. Then, during a second program time Tpgm2, a program operation may be performed on the string select transistor connected to the odd-numbered bit-line. The program ready operation performed during the second program ready time Tready2 is described with reference to FIG. 17.

Similarly, program voltages V'pgm1 to V'pgm3 may be applied to the gate electrode of the string select transistor connected to the odd-numbered bit-line through the string select line SSL in the ISPP scheme. For example, a magnitude of the program voltage V'pgm3 may be greater than a magnitude of the program voltage V'pgm2, and the magnitude of the program voltage V'pgm2 may be greater than a magnitude of the program voltage V'pgm1.

In FIG. 10, a case in which the program operation on the string select transistor connected to the even-numbered bit-line is performed first is employed by way of example. However, an embodiment is not limited thereto. For example, a program operation on the string select transistor connected to the odd-numbered bit-line may be performed first.

The program operation on the string select transistor connected to the even-numbered (or odd-numbered) bit-line has been completed, and then, the program operation on the string select transistor connected to the odd-numbered (or even-numbered) bit-line is performed. In this case, the data may be processed while only a half of the page buffer operates, such that the page buffer may process the data efficiently.

Figure 11:
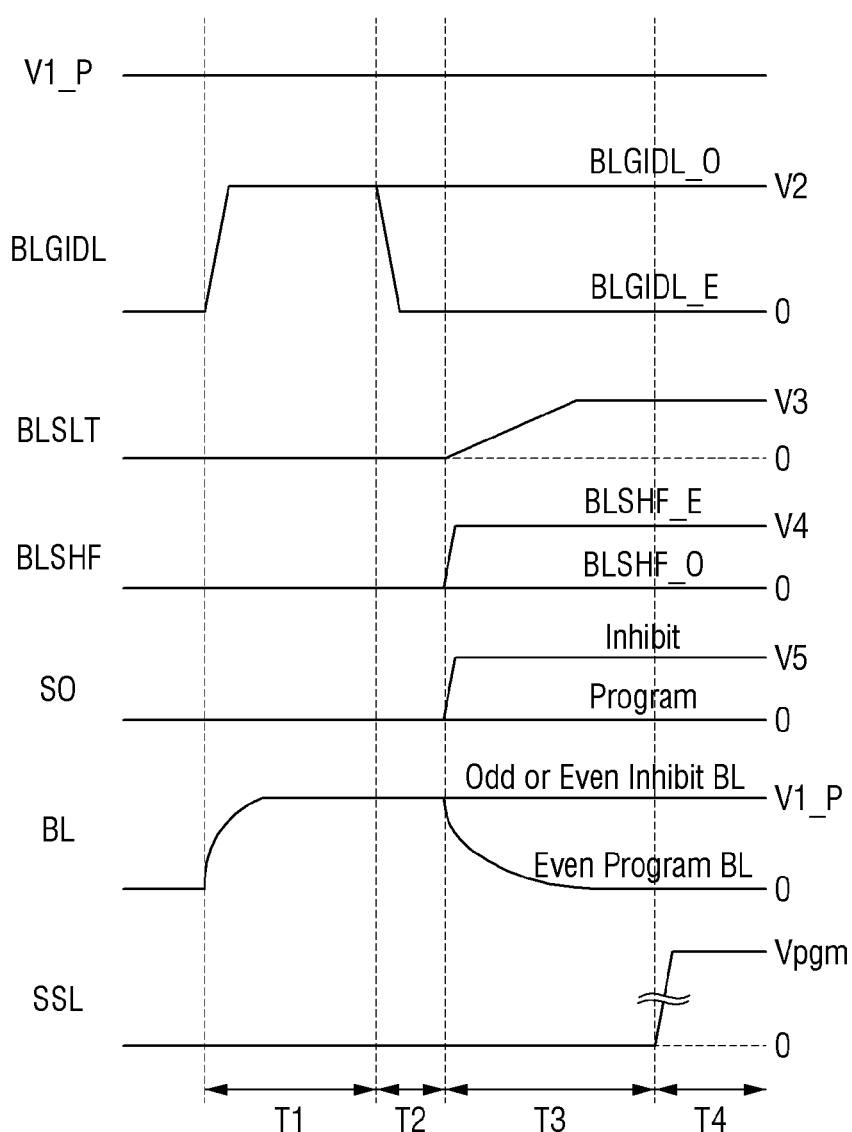
FIG. 11 is a timing diagram illustrating a program operation on an even-numbered bit-line group, according to some embodiments.

FIG. 11 is a timing diagram to illustrate a program operation on an even-numbered bit-line group.

A first time to a third time T1 to T3 of FIG. 11 may correspond to the first program ready time Tready1 of FIG. 10. A fourth time T4 in FIG. 11 may correspond to the first program time Tpgm1 in FIG. 10.

Figure 12:
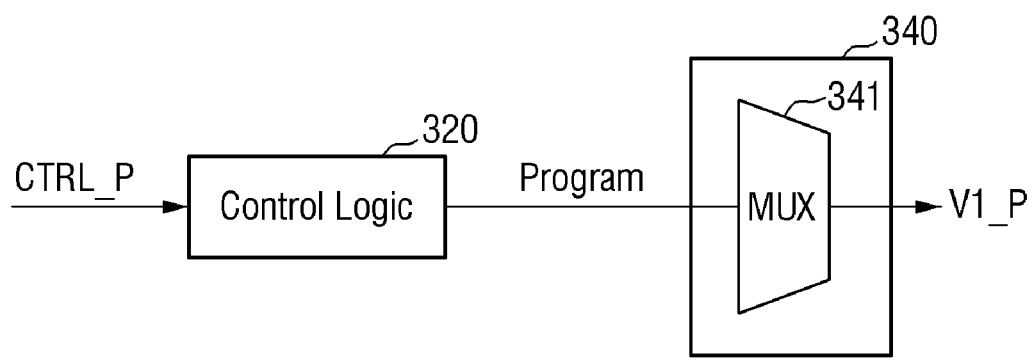
FIG. 12 is a diagram showing a state in which the multiplexer shown in FIG. 8 is set to a program state, according to some embodiments.

FIG. 12 is a diagram showing a state in which the multiplexer shown in FIG. 8 is set to a program state.

FIG. 13 to FIG. 16 are circuit diagrams for illustrating a program operation of a non-volatile memory device according to some embodiments.

Hereinafter, referring to FIG. 11 to FIG. 16, a program operation on the string select transistor connected to the even-numbered bit-line is described.

Figure 13:
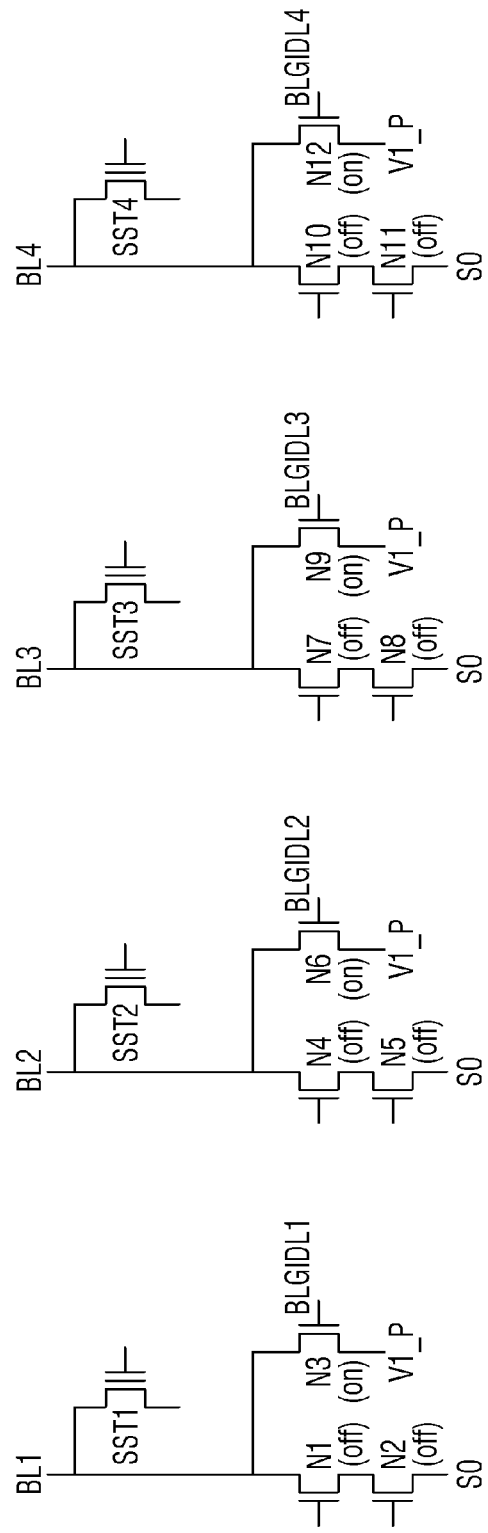
FIG. 13 to FIG. 16 are circuit diagrams illustrating a program operation of a non-volatile memory device, according to some embodiments.

Hereinafter, a case in which the string select transistor SST2 connected to the bit-line BL2 among the even-numbered bit-lines BL2 and BL4 as shown in FIG. 13 is programmed and the string select transistor SST4 connected to the bit-line BL4 the even-numbered bit-lines BL2 and BL4 as shown in FIG. 13 is not programmed (that is, is inhibited) is described by way of example. However, an embodiment is not limited thereto, and the string select transistor which may be programmed or inhibited may vary depending on an embodiment.

Referring to FIG. 12, when the control logic circuit 320 receives a control signal CTRL_P to instruct programming of the string select transistor from an external source, the control logic circuit 320 generates a program signal. When the voltage generator 340 receives the program signal from the control logic circuit 320, the multiplexer 341 may be set to the state 1 to output the program voltage V1_P.

Referring to FIG. 11 and FIG. 13, the program voltage V1_P generated from the voltage generator 340 may be applied to one end of each of the precharge transistors N3, N6, N9, and N12 of the bit-lines BL1 to BL4 for the first to fourth times T1 to T4.

During the first time T1, the program voltage V1_P may be applied to one end of each of the precharge transistors N3, N6, N9, and N12. Then, the precharge signals BLGIDL1 to BLGIDL4 generated from the control logic (e.g., control logic circuit 320 of FIG. 6) may be respectively applied to the gate electrodes of the precharge transistors N3, N6, N9, and N12.

The precharge transistors N3, N6, N9, and N12 may be respectively turned on based on the precharge signals BLGIDL1 to BLGIDL4. In this regard, a magnitude of the voltage of each of the precharge signals BLGIDL1 to BLGIDL4 for turning on the precharge transistors N3, N6, N9, and N12, respectively, may be greater than the magnitude of the program voltage V1_P. For example, the magnitude of the program voltage V1_P may be 5V, and the magnitude of the voltage V2 of each of the precharge signals BLGIDL1 to BLGIDL4 may be 10V. However, an embodiment is not limited thereto, and the magnitude of the voltage of each of the precharge signals BLGIDL1 to BLGIDL4 may vary depending on an embodiment.

When the precharge transistors N3, N6, N9, and N12 are turned on, the program voltage V1_P may be applied to the bit-lines BL1 to BL4 to precharge the bit-lines BL1 to BL4 to the program voltage V1_P. In this regard, the magnitude of the program voltage V1_P precharged to each of the bit-lines BL1 to BL4 may be a high voltage that is relatively larger than a magnitude of an internal power voltage of the page buffer 360. For example, the magnitude of the internal power voltage of the page buffer 360 may be 2V, while the magnitude of the program voltage V1_P may be 5V. However, an embodiment is not limited thereto, and the magnitude of the internal power voltage of the page buffer 360 and the magnitude of the program voltage V1_P may vary depending on an embodiment.

Figure 14:
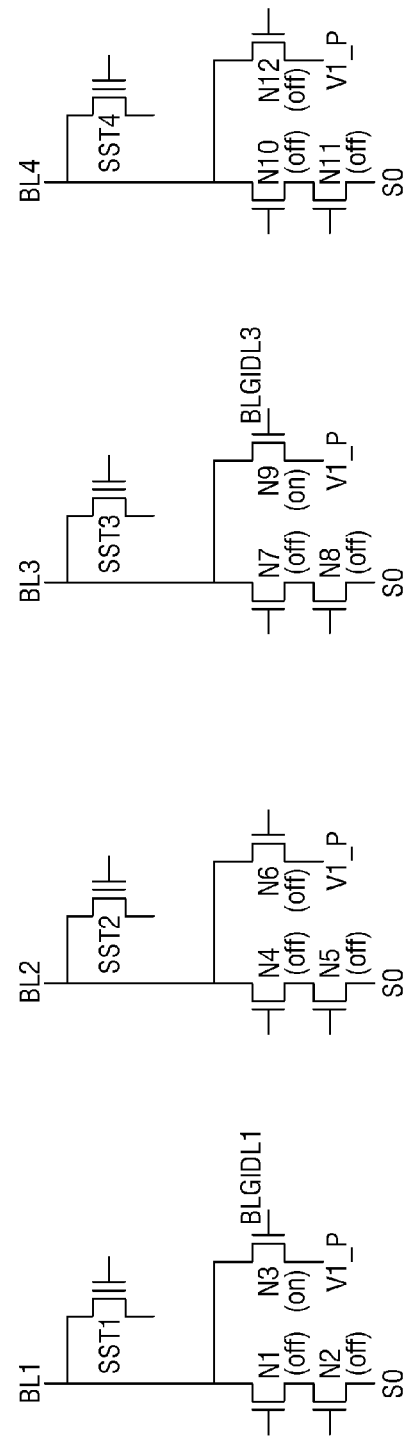

Referring to FIG. 11 and FIG. 14, the precharge signals BLGIDL2 and BLGIDL4 may not be applied to the gate electrodes of the precharge transistors N6 and N12 connected to the even-numbered bit-lines BL2 and BL4 during the second time T2. Accordingly, the precharge transistors N6 and N12 may be turned off.

Further, the discharge signals BLSLT2, BLSHF2, BLSLT4, and BLSHF4 may not be applied to the gate electrodes of the discharge transistors N4 and N5 connected to the bit-line BL2 and the discharge transistors N10 and N11 connected to the bit-line BL4 such that the discharge transistors N4 and N5 and the discharge transistors N10 and N11 may be turned off.

Accordingly, the bit-lines BL2 and BL4 may be in a floating state. Thus, the program voltage V1_P applied to the bit-lines BL2 and BL4 may be maintained during the first time T1.

During first time T1, the precharge transistors N3 and N9 respectively connected to the odd-numbered bit-lines BL1 and BL3 may maintain a turned-on state, and thus, the odd-numbered bit-lines BL1 and BL3 may maintain the precharged state.

Figure 15:
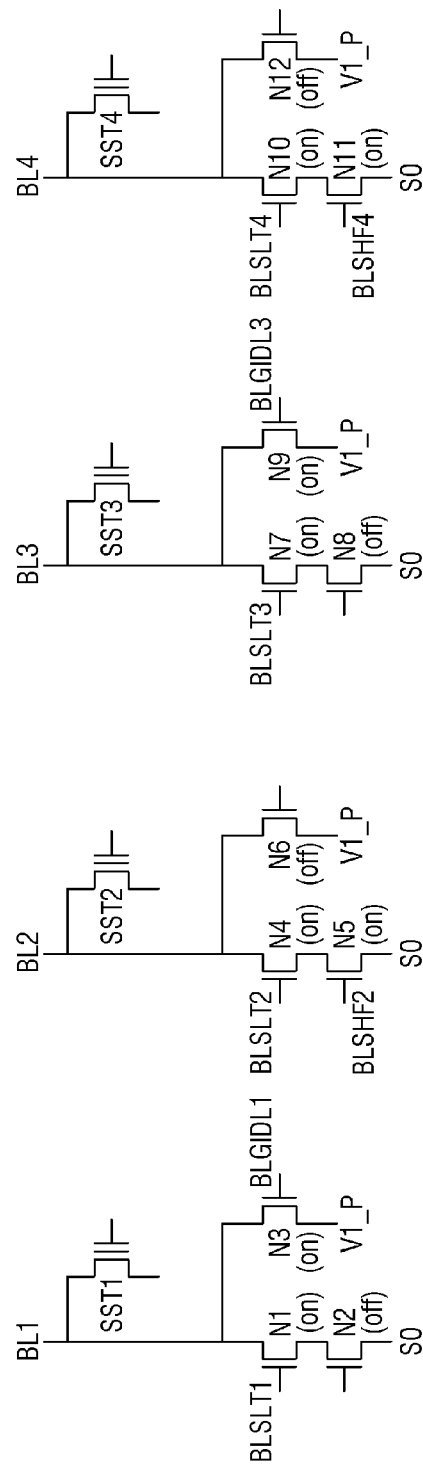

Referring to FIG. 11 and FIG. 15, during the third time T3, the discharge signals BLSLT2 and BLSHF2 generated from the control logic (e.g., control logic circuit 320 in FIG. 6) may be applied to the gate electrodes of the discharge transistors N4 and N5 connected to the bit-line BL2 to be programmed.

The discharge transistors N4 and N5 may be turned on based on the discharge signals BLSLT2 and BLSHF2, respectively.

Further, a ground voltage may be applied to the node S0 connected to one end of the discharge transistor N5. Accordingly, the program voltage V1_P precharged to the bit-line BL2 may be discharged. Since the bit-line BL2 precharged to the program voltage V1_P for the first to second times T1 to T2 is discharged to the ground voltage during the third time T3, the string select transistor SST2 connected to the bit-line BL2 may be programmed with the program voltages (e.g., Vpgm1 to Vpgm3 in FIG. 10) applied to the string select line SSL.

When the bit-line BL2 is discharged to the ground voltage, a magnitude of voltage V3 of the discharge signal BLSLT2 may be less than or equal to the magnitude of internal power voltage of the page buffer 360. The magnitude of the voltage V3 of the discharge signal BLSLT2 may be, for example, 1.5V or lower.

When the bit-line BL2 is discharged to the ground voltage, a magnitude of a voltage V4 of the discharge signal BLSHF2 may be, for example, 1.5V. However, an embodiment is not limited thereto, and the magnitude of the voltage V4 of the discharge signal BLSHF2 may vary depending on an embodiment.

When the bit-line BL2 precharged to the high voltage is discharged to the ground voltage, a voltage having a magnitude less than or equal to the magnitude of the internal power voltage of the page buffer 360 may be applied to the discharge transistor N4 to prevent damage to the page buffer 360, which is usually composed of a low voltage transistor, such that a clamped voltage may be applied to the discharge transistor N5.

Further, the bit-line BL2 may be discharged to the ground voltage via a ramping step of the discharge transistor N4, such that the voltage applied to adjacent bit-lines (e.g., BL1 and BL3) couples-down may be prevented from coupling-down.

During the third time T3, the discharge signals BLSLT4 and BLSHF4 generated from the control logic (e.g., control logic circuit 320 of FIG. 6) may be applied to the gate electrodes of the discharge transistors N10 and N11 connected to an unprogrammed bit-line BL4, respectively.

The discharge transistors N10 and N11 may be turned on based on the discharge signals BLSLT4 and BLSHF4, respectively.

Voltage V5 may be applied to the node S0 connected to one end of the discharge transistor N11. The voltage V5 may be, for example, an internal power voltage of the page buffer 360. For example, the magnitude of the voltage V5 may be 2V. However, an embodiment is not limited thereto, and the magnitude of the voltage V5 may vary according to an embodiment.

Accordingly, the program voltage V1_P precharged to the bit-line BL4 may not be discharged, and thus, the bit-line BL4 may maintain the precharged state. Therefore, even when the program voltage Vpgm is applied to the gate electrode of the string select transistor SST4 connected to the bit-line BL4 through the string select line SSL, the string select transistor SST4 may be inhibited.

During the third time T3, the precharge transistors N3 and N9 respectively connected to the odd-numbered bit-lines BL1 and BL3 may maintain a turned-on state based on the precharge signals BLGIDL1 and BLGIDL3, respectively, while the discharge transistors N1 and N7 may be turned on based on the discharge signals BLSLT1 and BLSLT3, respectively.

However, since the discharge signals BLSHF1 and BLSHF3 are not applied to the gate electrodes of the discharge transistors N2 and N8, respectively, and thus the discharge transistors N2 and N8 are turned off, the bit-lines BL1 and BL3 may maintain the precharged state.

Accordingly, the string select transistors SST1 and SST3 respectively connected to the odd-numbered bit-lines BL1 and BL3 may not be programmed.

When the string select transistors SST1 to SST4 respectively connected to the bit-lines BL1 to BL4 are programmed, the program operation may be separately performed on the numbered bit-line group and the odd-numbered bit-line group such that the couple-down phenomenon in which adjacent bit-lines to the discharged bit-line are unexpectedly discharged due to the discharged bit-line may be prevented.

Figure 16:
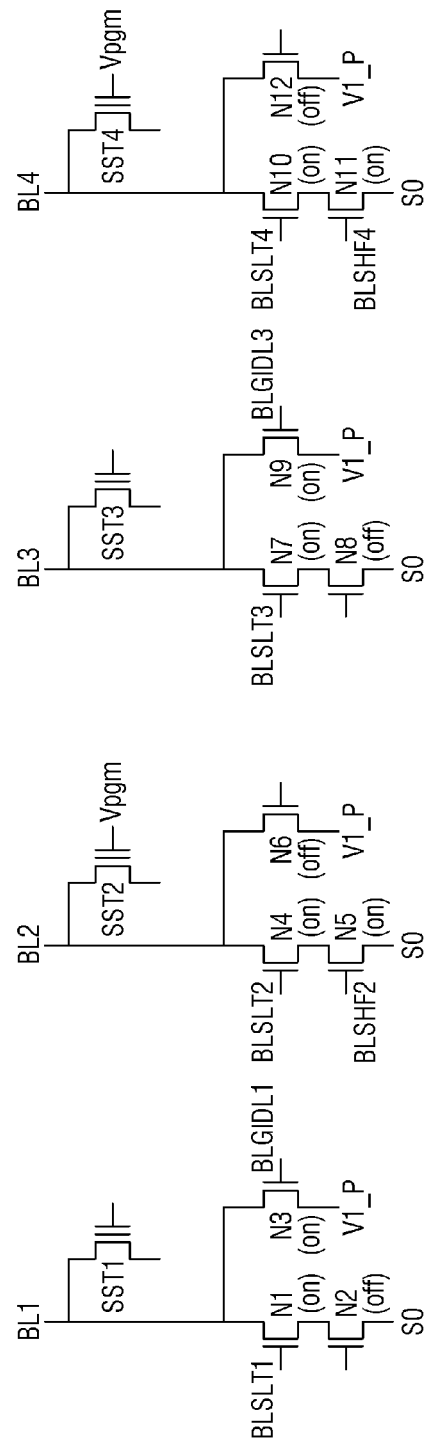

Referring to FIG. 11 and FIG. 16, the program voltage Vpgm may be applied to the gate electrodes of the string select transistors SST2 and SST4 respectively connected to the even-numbered bit-lines BL2 and BL4 during the fourth time T4. An operation in which the program voltage Vpgm is applied to the gate electrode of the string select transistor to program the string select transistor has been described above with reference to FIG. 10, and thus redundant description thereof is omitted.

Figure 17:
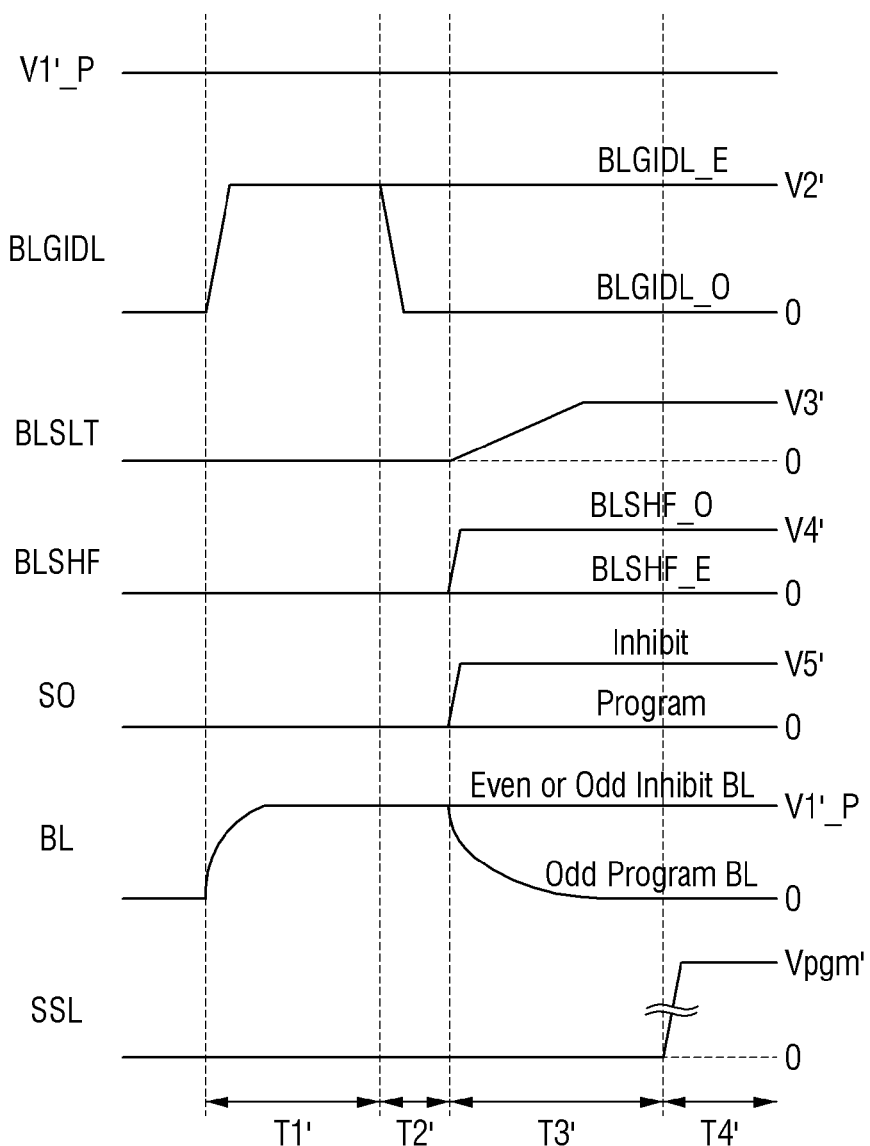
FIG. 17 is a timing diagram illustrating a program operation on an odd-numbered bit-line group, according to some embodiments.

FIG. 17 is a timing diagram to illustrate a program operation on an odd-numbered bit-line group.

A first time to a third time T1' to T3' in FIG. 17 may correspond to the second program ready time Tready2 in FIG. 10. A fourth time T4' in FIG. 17 may correspond to the second program time Tpgm2 in FIG. 10.

The program operation on the odd-numbered bit-line group is similar to the program operation on the even-numbered bit-line group as described above with reference to FIG. 11 to FIG. 16 except that the operation on the even-numbered bit-line and the operation on the odd-numbered bit-line in the program operation on the even-numbered bit-line group as described above with reference to FIG. 11 to FIG. 16 are exchanged with each other in the program operation on the odd-numbered bit-line group. Thus, the duplicate description thereof is omitted.

Hereinafter, with reference to FIG. 18 and FIG. 19, an erase operation according to some embodiments is described.

Figure 18:
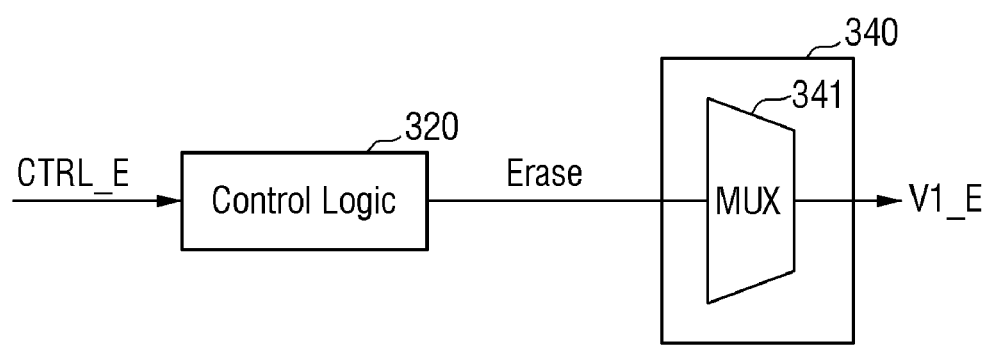
FIG. 18 is a diagram showing a state in which the multiplexer shown in FIG. 8 is set to an erase state, according to some embodiments.

FIG. 18 is a diagram showing a state in which the multiplexer 341 shown in FIG. 8 is set to an erase state.

Referring to FIG. 18, when the control logic circuit 320 receives a control signal CTRL_E to instruct erasing of the data stored in the memory cell from an external source, the control logic circuit 320 generates an erase signal. When the voltage generator 340 receives the erase signal from the control logic circuit 320, the multiplexer 341 may be set to the state 0 (e.g., a low level) to output an erase voltage V1_E.

Figure 19:
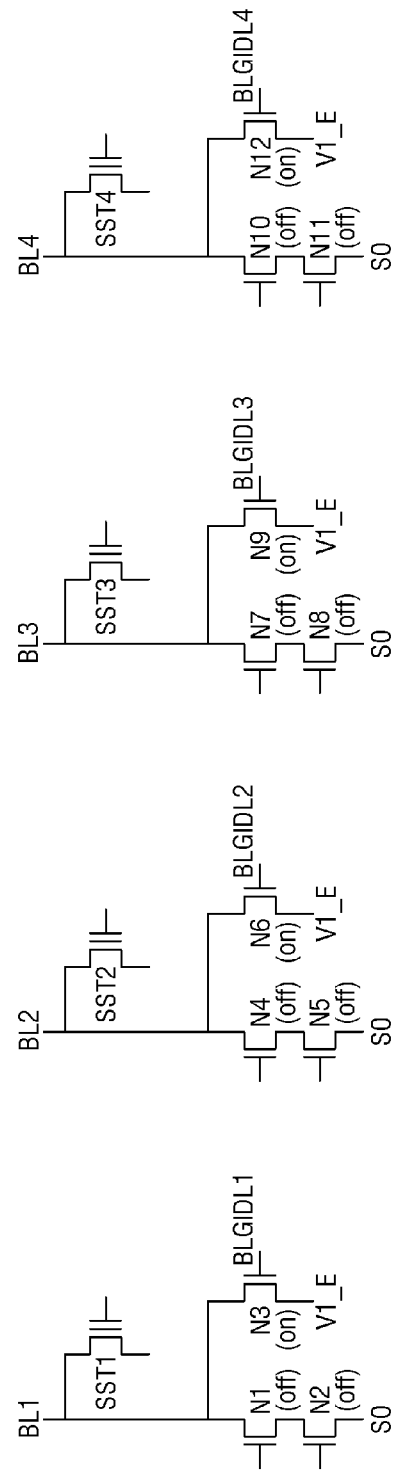
FIG. 19 is a circuit diagram illustrating an erase operation of a non-volatile memory device, according to some embodiments.

FIG. 19 is a circuit diagram for illustrating an erase operation of a non-volatile memory device according to some embodiments.

Referring to FIG. 19, during the erase operation on the data stored in the memory cell, the erase voltage V1_E may be applied to one end of each of the precharge transistors N3, N6, N9, and N12 of the bit-lines BL1 to BL4. Each of the precharge transistors N3, N6, N9, and N12 may apply the erase voltage V1_E to each of the bit-lines BL1 to BL4 during the erase operation of the non-volatile memory device.

Thus, in some embodiments, the precharge transistor connected to the bit-line may perform simultaneously the operation of precharging the high voltage into the bit-line when programming the string select transistor, and the operation of precharging the high voltage into the bit-line when erasing the data stored in the memory cell without additional circuit area increase. Accordingly, the operation margin of the string select transistor in the vertical NAND (VNAND) may be improved.

Figure 20:
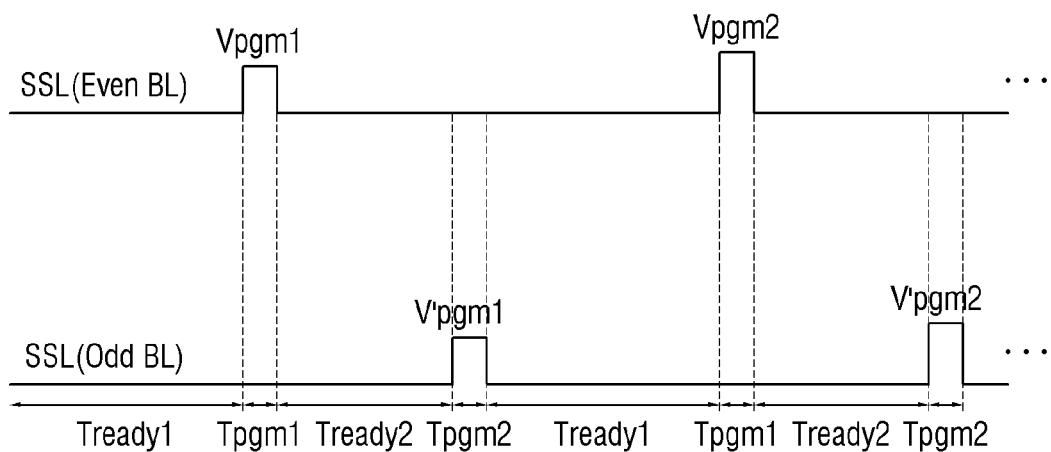
FIG. 20 is a timing diagram specifying a scheme in which a program voltage is applied to a gate electrode of a string select transistor, according to some embodiments.

FIG. 20 is a timing diagram specifying a scheme in which a program voltage is applied to a gate electrode of a string select transistor according to some embodiments.

In FIG. 20, operations performed during a first program ready time Tready1, a first program time Tpgm1, a second program ready time Tready2, and a second program time Tpgm2 are similar to as those described in reference to FIG. 10. Duplicate descriptions are omitted but differences therebetween are mainly described below.

Referring to FIG. 20, in some further embodiments, a program operation on a string select transistor connected to an even-numbered bit-line and a program operation on a string select transistor connected to an odd-numbered bit-line using a program voltage of the same (e.g., substantially the same) magnitude may be performed in an alternate manner.

For example, using the program voltage Vpgm1, a program operation on a string select transistor connected to an even-numbered bit-line may be performed. Before the ISPP operation on the string select transistor connected to the even-numbered bit-line has been completed, a program operation may be performed on a string select transistor connected to an odd-numbered bit-line using a program voltage V'pgm1 having the same (e.g., substantially the same) magnitude as that of the program voltage Vpgm1.

Thereafter, a program operation may be performed on the string select transistor connected to the even-numbered bit-line using a program voltage Vpgm2 greater than the program voltage Vpgm1. Before the ISPP operation on the string select transistor connected to the even-numbered bit-line has been completed, a program operation may be performed on the string select transistor connected to the odd-numbered bit-line using a program voltage V'pgm2 of the same magnitude as that of the program voltage Vpgm2.

In this manner, while the magnitude of the program voltage is increased in the ISPP scheme, the program operation on the string select transistor connected to the even-numbered bit-line and the program operation on the string select transistor connected to the odd-numbered bit-line may be alternately performed using the program voltage of the same magnitude until the program operation has been completed.

In FIG. 20, a case where the program operation on the string select transistor connected to the even-numbered bit-line is performed first is employed by way of example. However, an embodiment is not limited thereto. According to an embodiment, the program operation on the string select transistor connected to the odd-numbered bit-line may be performed first.

In this way, while the magnitude of the program voltage is increased in the ISPP scheme, the program operation on the string select transistor connected to the even-numbered bit-line and the program operation on the string select transistor connected to the odd-numbered bit-line may be alternately performed using the program voltage of the same magnitude, such that a data cooking time in the page buffer may be shortened compared to that in the embodiment as shown in FIG. 10.

Figure 21:
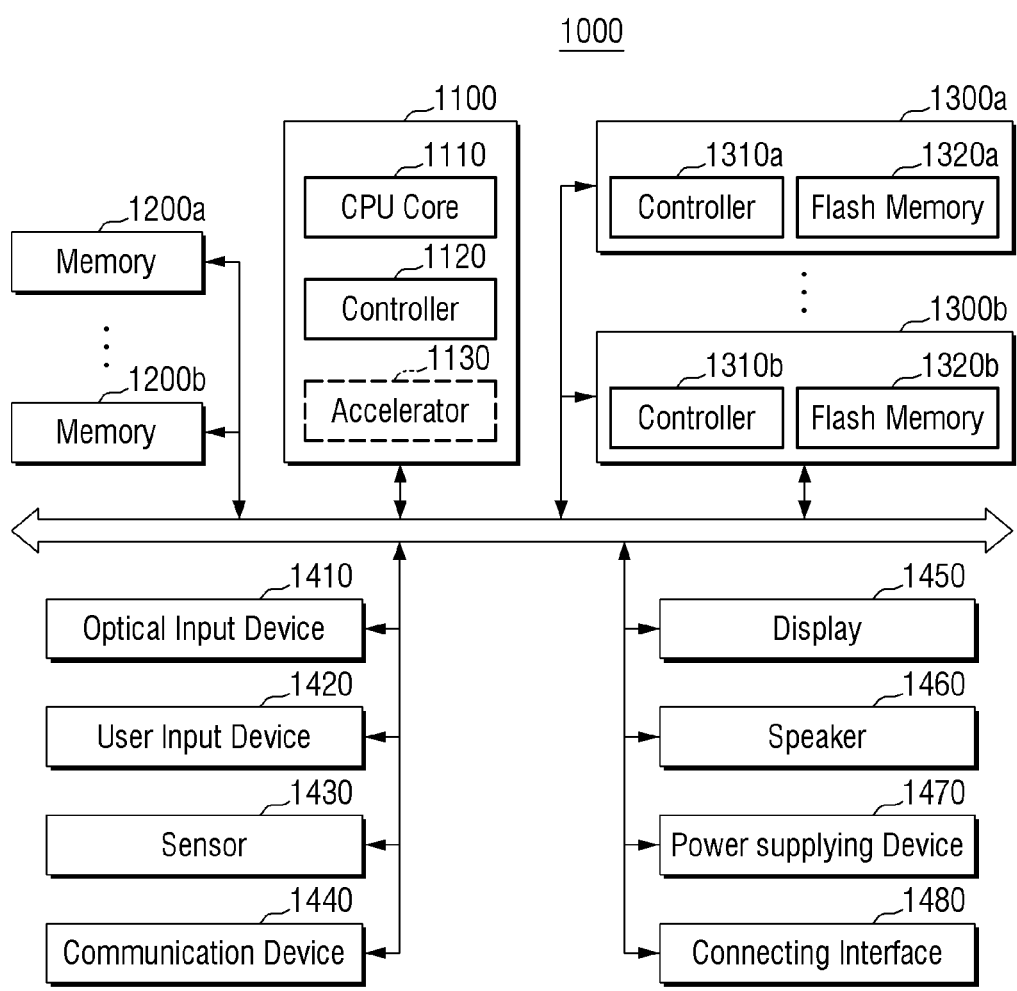
FIG. 21 is an illustrative block diagram illustrating a system including a non-volatile memory device, according to some embodiments.

FIG. 21 is an illustrative block diagram for illustrating a system including a non-volatile memory device according to some embodiments.

Referring to FIG. 21, a system 1000 may basically be a mobile system such as a portable communication terminal (e.g., mobile phone), a smart phone, a tablet personal computer, a wearable device, a healthcare device, or an internet of things (IoT) device. However, the system 1000 in FIG. 21 is not necessarily limited to the mobile system, and may be a personal computer, a laptop computer, a server, a media player, an automotive device such as navigation, and the like.

Referring to FIG. 21, the system 1000 may include a main processor 1100, a memory (e.g., 1200a to 1200b, hereinafter "1200" generally), and a storage device (e.g., 1300a and 1300b, hereinafter "1300" generally). The system 1000 may further include at least one of an optical input device 1410 (e.g., image capturing device), a user input device 1420, a sensor 1430, a communication device 1440, a display 1450, a speaker 1460, a power supplying device 1470, and a connecting interface 1480. The storage devices 1300 may be embodied as the non-volatile memory device (e.g., NVM devices 300 of FIGS. 1-4), according to some embodiments.

The main processor 1100 may control overall operations of the system 1000, more specifically, operations of other components constituting the system 1000. The main processor 1100 may be implemented as a general-purpose processor, a dedicated processor, or an application processor.

The main processor 1100 may include one or more CPU cores 1110, and may further include a controller 1120 for controlling the memory 1200 and/or the storage devices 1300. According to an embodiment, the main processor 1100 may further include an accelerator block 1130 as a dedicated circuit for high-speed data computing such as artificial intelligence (AI) data computing. The accelerator block 1130 may include a graphics processing unit (GPU), a neural processing unit (NPU), and/or a data processing unit (DPU). The accelerator block 1130 may be implemented as a separate chip physically independent from other components of the main processor 1100.

The memory 1200 may be used as a main memory device of the system 1000, and may include a volatile memory such as static RAM (SRAM) and/or dynamic RAM (DRAM), and/or may include a non-volatile memory such as flash memory, PRAM, and/or RRAM. The memory 1200 and the main processor 1100 may be implemented in the same package.

The storage devices 1300 may function as a non-volatile storage device that stores therein data regardless of whether power is supplied thereto, and may have a relatively large storage capacity compared to that of the memory 1200. Each of the storage devices 1300 may include a storage controller (e.g., 1310a and 1310b), and a non-volatile memory (NVM) storage 1320a and 1320b that stores therein data under control of the storage controller 1310a and 1310b. The NVM storage 1320a and 1320b may include a V-NAND flash memory of a 3D structure or a 2D structure, or may include other types of non-volatile memories such as PRAM and/or RRAM.

The storage devices 1300 may be included in the system 1000 in a state physically separated from the main processor 1100. Alternatively or additionally, the storage devices 1300 and the main processor 1100 may be implemented in the same package. Further, the storage devices 1300 may be embodied in a form of a memory card and thus may be detachably coupled to other components of the system 1000 via an interface such as the connecting interface 1480 to be described below. each of the storage devices 1300 may be a device to which a standard protocol such as UFS is applied. However, the present disclosure is not necessarily limited thereto.

The optical input device 1410 may image (e.g., capture) a still image and/or a video, and may be embodied as a camera, a camcorder, and/or a webcam.

The user input device 1420 may receive various types of data input from a user of the system 1000, and may be embodied as, but not be limited to, a touch pad, a keyboard, a keypad, a mouse, a microphone, and/or a combination thereof.

The sensor 1430 may detect various types of physical quantities that may be acquired from an external environment to the system 1000 and convert the sensed physical quantities into one or more electrical signals. The sensor 1430 may include, but not be limited to, a temperature sensor, a pressure sensor, an illuminance sensor, a position sensor, an acceleration sensor, a biosensor, a gyroscope, and/or a combination thereof.

The communication device 1440 may transmit and/or receive signals between the system 1000 and other devices outside the system 1000 according to various communication protocols. The communication device 1440 may include, but not be limited to, an antenna, a transceiver, a modem, and/or a combination thereof.

The display 1450 and the speaker 1460 may function as output devices for outputting visual information and auditory information to the user of the system 1000, respectively.

The power supplying device 1470 may appropriately convert power supplied from an external power source and/or a battery (not shown) built in the system 1000, and supply the converted power to each of the components of the system 1000.

The connecting interface 1480 may provide connection between the system 1000 and an external device connected to the system 1000 to exchange data with the system 1000. The connecting interface 1480 may be implemented in various interface schemes including, but not limited to, advanced technology attachment (ATA), serial ATA (SATA), e-SATA (external SATA), small computer small interface (SCSI), serial-attached SCSI (SAS), peripheral component interconnection (PCI), PCI express (PCIe), NVMe, Institute of Electrical and Electronics Engineers (IEEE) 1394 standard, universal serial bus (USB), secure digital (SD) card, multi-media card (MMC), embedded MMC (eMMC), UFS, embedded UFS (eUFS), compact flash (CF) card interface, a combination thereof, and the like.

Although the embodiments of the present disclosure have been described above with reference to the accompanying drawings, the present disclosure may not be limited to the embodiments and may be implemented in various different forms. Those of ordinary skill in the technical field to which the present disclosure belongs are able to understand that the present disclosure may be implemented in other specific forms without changing the technical idea or essential features of the present disclosure. Therefore, it should be understood that the embodiments as described above are illustrative in all respects and are not restrictive.

What is claimed is:

1. A non-volatile memory device, comprising:
a control logic circuit configured to generate a program signal based on a first control signal and to generate an erase signal based on a second control signal;
a voltage generator configured to generate a program voltage based on the program signal received from the control logic circuit and to generate an erase voltage based on the erase signal received from the control logic circuit, wherein the erase voltage is greater than the program voltage;
a memory cell array including a memory cell, a string select transistor coupled to the memory cell, a bit-line coupled to the string select transistor, and a string select line coupled to the string select transistor; and
a page buffer circuit coupled to the bit-line, and including a first precharge transistor that is configured to operate based on the program signal and the erase signal,
wherein the first precharge transistor is configured to:
when the string select transistor is programmed in response to the program signal, apply the program voltage to the bit-line, wherein the program voltage is greater than an internal power voltage of the page buffer circuit; and
when the memory cell is erased in response to the erase signal, apply the erase voltage to the bit-line.

2. The non-volatile memory device of claim 1, wherein when the string select transistor is programmed in response to the program signal, a first magnitude of a first voltage of the program signal is greater than a second magnitude of the program voltage.

3. The non-volatile memory device of claim 1, wherein the page buffer circuit further includes a first discharge transistor coupled to the bit-line, and configured to discharge a voltage of the bit-line, based on a first discharge signal.

4. The non-volatile memory device of claim 3, wherein the page buffer circuit further includes a second discharge transistor coupled to the bit-line and the first discharge transistor, and configured to discharge the voltage of the bit-line, based on a second discharge signal.

5. The non-volatile memory device of claim 4, wherein when the bit-line to which the program voltage has been applied is discharged to a ground voltage, a second magnitude of a second voltage of the second discharge signal is less than or equal to the internal power voltage of the page buffer circuit.

6. The non-volatile memory device of claim 4, wherein the second discharge transistor is further configured to be subjected to a ramping step to discharge the voltage of the bit-line.

7. The non-volatile memory device of claim 1, wherein
the bit-line includes a first bit-line, a second bit-line, and a third bit-line,
the string select transistor includes a first string select transistor, a second string select transistor, and a third string select transistor,
the page buffer circuit further includes a first discharge circuit, a second precharge transistor, a second discharge circuit, a third precharge transistor and a third discharge circuit,
the first bit-line is coupled to the first precharge transistor, the first string select transistor, and the first discharge circuit,
the second bit-line is coupled to the second precharge transistor, the second string select transistor, and the second discharge circuit,
the third bit-line is coupled to the third precharge transistor, the third string select transistor, and the third discharge circuit,
the second bit-line is disposed between the first bit-line and the third bit-line, and
the control logic circuit is further configured to:
turn on each of the first to third precharge transistors to precharge each of the first to third bit-lines to the program voltage;
turn off each of the first precharge transistor and the third precharge transistor to bring each of the first bit-line and the third bit-line into a floating state; and
maintain a turned-on state of the second precharge transistor so that the second bit-line is maintained in a precharged state.

8. The non-volatile memory device of claim 7, wherein
the first discharge circuit further includes a first discharge transistor,
the second discharge circuit further includes a second discharge transistor,
the third discharge circuit further includes a third discharge transistor, and
the control logic circuit is further configured to:
turn on the first discharge transistor to discharge the first bit-line to a ground voltage; and
turn off each of the second discharge transistor and the third discharge transistor such that each of the second bit-line and the third bit-line is maintained in the precharged state.

9. The non-volatile memory device of claim 8, wherein
the first discharge circuit further includes a fourth discharge transistor, and
when the first bit-line is discharged to the ground voltage, a voltage applied to a gate electrode of the fourth discharge transistor is less than or equal to the internal power voltage of the page buffer circuit.

10. The non-volatile memory device of claim 9, wherein the control logic circuit is further configured to apply the program voltage to gate electrodes of the string select transistors coupled to the first to third bit-lines.

11. A non-volatile memory device, comprising:
a first bit-line coupled to a first memory cell and a first string select transistor;
a second bit-line coupled to a second memory cell and a second string select transistor;
a third bit-line coupled to a third memory cell and a third string select transistor, wherein the third bit-line is disposed between the first bit-line and the second bit-line;
a first precharge circuit coupled to the first bit-line, and including a first precharge transistor that is configured to operate based on a first precharge signal;

a second precharge circuit coupled to the second bit-line, and including a second precharge transistor that is configured to operate based on a second precharge signal;

a third precharge circuit coupled to the third bit-line, and including a third precharge transistor that is configured to operate based on a third precharge signal;

a first discharge circuit coupled to the first bit-line and configured to discharge a first precharge voltage applied to the first bit-line based on a first discharge signal;

a second discharge circuit coupled to the second bit-line and configured to discharge a second precharge voltage applied to the second bit-line based on a second discharge signal;

a third discharge circuit coupled to the third bit-line and configured to discharge a third precharge voltage applied to the third bit-line based on a third discharge signal; and a control logic circuit configured to:
generate the first to third precharge signals and the first to third discharge signals;
turn on, during a first time period, each of the first to third precharge transistors to apply each of the first to third precharge voltages to each of the first to third bit-lines;
turn off, during a second time period, each of the first precharge transistor and the second precharge transistor to bring each of the first bit-line and the second bit-line into a floating state, and maintain the third precharge transistor in a turned-on state to maintain the third bit-line in a precharged state;
control, during a third time period, the first discharge circuit to discharge the first bit-line to a ground voltage, and control each of the second discharge circuit and the third discharge circuit to maintain each of the second bit-line and the third bit-line in the precharged state; and
apply, during a fourth time period, a program voltage to a gate electrode of each of the first to third string select transistors.

12. The non-volatile memory device of claim 11, further comprising a voltage generator configured to generate an erase voltage,
wherein the control logic circuit is further configured to turn on the first precharge transistor to apply the erase voltage to the first bit-line during an erase operation on the first memory cell.

13. The non-volatile memory device of claim 12, wherein the erase voltage is greater than the first precharge voltage.

14. The non-volatile memory device of claim 11, wherein a program operation on the first to third string select transistors is performed in an incremental step pulse program (ISPP) scheme.

15. The non-volatile memory device of claim 11, further comprising a page buffer circuit including the first to third precharge circuits and the first to third discharge circuits,
wherein each of the first to third precharge voltages is greater than an internal power voltage of the page buffer circuit.

16. The non-volatile memory device of claim 11, wherein the first discharge circuit includes a first discharge transistor, and
the control logic circuit is further configured to, when the first bit-line is discharged to the ground voltage, apply a voltage smaller than the first precharge voltage to a gate electrode of the first discharge transistor.

17. The non-volatile memory device of claim 16, further comprising a page buffer circuit including the first to third precharge circuits and the first to third discharge circuits,
wherein the first discharge circuit further includes a second discharge transistor, and
wherein the control logic circuit is further configured to, when the first bit-line is discharged to the ground voltage, apply a voltage less than or equal to an internal power voltage of the page buffer circuit to a gate electrode of the second discharge transistor.

18. A method for operating a non-volatile memory device, comprising:
turning on each of a plurality of precharge transistors of the non-volatile memory device to precharge each of a plurality of bit-lines of the non-volatile memory device to a first voltage;
turning off first precharge transistors coupled to even-numbered bit-lines of the plurality of bit-lines among the plurality of precharge transistors, and maintaining second precharge transistors coupled to odd-numbered bit-lines of the plurality of bit-lines among the plurality of precharge transistors in a turned-on state;
discharging first bit-lines among the even-numbered bit-lines to a second voltage, and maintaining second bit-lines among the even-numbered bit-lines, and the odd-numbered bit-lines in a precharged state; and
applying a program voltage to gate electrodes of string select transistors coupled to the plurality of bit-lines,
wherein the first voltage is greater than an internal power voltage of a page buffer of the non-volatile memory device.

19. The method of claim 18, wherein
the applying of the program voltage to the gate electrodes comprises performing a first incremental step pulse program (ISPP) operation on string select transistors coupled to the even-numbered bit-lines, and
wherein the method further comprises:
after the first ISPP operation has been completed, turning on the plurality of precharge transistors to precharge the plurality of bit-lines to the first voltage;
turning off the second precharge transistors coupled to the odd-numbered bit-lines among the plurality of precharge transistors, and maintaining the first precharge transistors coupled to the even-numbered bit-lines in the turned-on state;
discharging third bit-lines among the odd-numbered bit-lines to the second voltage, and maintaining fourth bit-lines among the odd-numbered bit-lines, and the even-numbered bit-lines in the precharged state; and
performing a second ISPP operation on string select transistors coupled to the odd-numbered bit-lines.

20. The method of claim 18, wherein
the applying of the program voltage to the gate electrodes of the string select transistors coupled to the plurality of bit-lines includes performing a first incremental step pulse program (ISPP) operation on string select transistors coupled to the even-numbered bit-lines, and
wherein the method further comprises:
before the first ISPP operation has been completed, turning on the plurality of precharge transistors to precharge the plurality of bit-lines to the first voltage;
turning off the second precharge transistors coupled to the odd-numbered bit-lines among the plurality of precharge transistors, and maintaining the first precharge transistors coupled to the even-numbered bit-lines among the plurality of precharge transistors in the turned on state;

discharging third bit-lines among the odd-numbered bit-lines to the second voltage, and maintaining fourth bit-lines among the odd-numbered bit-lines, and the even-numbered bit-lines in the precharged state; and performing a second ISPP on string select transistors coupled to the odd-numbered bit-lines.

* * * * *